(12) United States Patent
Schroeder

(10) Patent No.: US 10,276,674 B2
(45) Date of Patent: Apr. 30, 2019

(54) METHOD OF FORMING A GATE CONTACT STRUCTURE AND SOURCE/DRAIN CONTACT STRUCTURE FOR A SEMICONDUCTOR DEVICE

(71) Applicant: GLOBALFOUNDRIES Inc., Grand Cayman (KY)

(72) Inventor: Uwe Paul Schroeder, Santa Cruz, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 130 days.

(21) Appl. No.: 15/194,682

(22) Filed: Jun. 28, 2016

(65) Prior Publication Data

US 2017/0373161 A1 Dec. 28, 2017

(51) Int. Cl.
| | |
|---|---|
| *H01L 29/00* | (2006.01) |
| *H01L 29/417* | (2006.01) |
| *H01L 29/66* | (2006.01) |
| *H01L 29/49* | (2006.01) |
| *H01L 21/768* | (2006.01) |
| *H01L 29/78* | (2006.01) |

(52) U.S. Cl.
CPC .... *H01L 29/41791* (2013.01); *H01L 21/7684* (2013.01); *H01L 29/495* (2013.01); *H01L 29/4966* (2013.01); *H01L 29/6653* (2013.01); *H01L 29/6656* (2013.01); *H01L 29/66795* (2013.01); *H01L 29/7851* (2013.01)

(58) Field of Classification Search
CPC ......... H01L 29/41791; H01L 21/31111; H01L 21/7684; H01L 29/495; H01L 29/4966; H01L 29/6653; H01L 29/6656; H01L 29/66795
See application file for complete search history.

(56) References Cited

U.S. PATENT DOCUMENTS

| | | |
|---|---|---|
| 4,692,349 A | 9/1987 | Georgiou et al. |
| 6,018,185 A | 1/2000 | Mitani et al. |

(Continued)

OTHER PUBLICATIONS

Final Office Action from related U.S. Appl. No. 14/887,927 dated Jan. 12, 2017.

(Continued)

*Primary Examiner* — Mounir S Amer
*Assistant Examiner* — Alexander Belousov
(74) *Attorney, Agent, or Firm* — Amerson Law Firm, PLLC

(57) ABSTRACT

One illustrative method disclosed includes, among other things, forming a sacrificial S/D contact structure above an S/D region of a transistor device, removing at least a portion of a gate cap and at least a portion of a gate sidewall spacer to define a gate contact cavity that is positioned entirely above the active region and exposes an upper surface of a gate structure of the transistor device, and forming an internal sidewall spacer within the gate contact cavity. The method also includes performing at least one process operation to remove at least the sacrificial S/D contact structure and define a S/D contact cavity, and forming a gate contact structure within the gate contact cavity that is conductively coupled to the gate structure and forming a S/D contact structure within the S/D contact cavity that is conductively coupled to the S/D region.

20 Claims, 20 Drawing Sheets

(56) References Cited

U.S. PATENT DOCUMENTS

| | | | |
|---|---|---|---|
| 6,225,663 | B1 | 5/2001 | Yamaguchi et al. |
| 6,346,438 | B1 | 2/2002 | Yagishita et al. |
| 6,566,718 | B2 | 5/2003 | Wieczorek et al. |
| 8,557,665 | B2 | 10/2013 | Wei et al. |
| 8,703,556 | B2 | 4/2014 | Kelly et al. |
| 8,765,546 | B1 | 7/2014 | Hung et al. |
| 9,024,388 | B2 | 5/2015 | Choi et al. |
| 9,147,748 | B1 * | 9/2015 | Xie .................. H01L 29/66545 |
| 2004/0087148 | A1 | 5/2004 | Wong |
| 2009/0212433 | A1 | 8/2009 | Yang et al. |
| 2011/0147765 | A1 | 6/2011 | Huang et al. |
| 2012/0104512 | A1 | 5/2012 | Horak et al. |
| 2012/0107970 | A1 | 5/2012 | Takaki |
| 2013/0175583 | A1 | 7/2013 | Yuan et al. |
| 2013/0187203 | A1 | 7/2013 | Xie et al. |
| 2013/0248950 | A1 | 9/2013 | Kang et al. |
| 2013/0334651 | A1 | 12/2013 | Doris et al. |
| 2014/0110798 | A1 | 4/2014 | Cai et al. |
| 2014/0308794 | A1 | 10/2014 | Lee et al. |
| 2015/0076609 | A1 | 3/2015 | Xie et al. |
| 2015/0091100 | A1 | 4/2015 | Xie et al. |
| 2015/0108589 | A1 | 4/2015 | Cheng et al. |
| 2016/0049487 | A1 * | 2/2016 | Xu ..................... H01L 29/41791 257/288 |
| 2016/0079354 | A1 | 3/2016 | Park et al. |
| 2016/0133623 | A1 * | 5/2016 | Xie ....................... H01L 27/088 257/384 |

OTHER PUBLICATIONS

Notice of Allowance from related U.S. Appl. No. 15/639,095, dated Apr. 30, 2018.

Office Action from related U.S. Appl. No. 14/927,765 dated May 20, 2016.

Office Action from related U.S. Appl. No. 14/887,927 dated Aug. 25, 2016.

Final Office Action from related U.S. Appl. No. 14/927,765 dated Nov. 17, 2016.

Office Action from related U.S. Appl. No. 14/927,765 dated May 2, 2017.

* cited by examiner

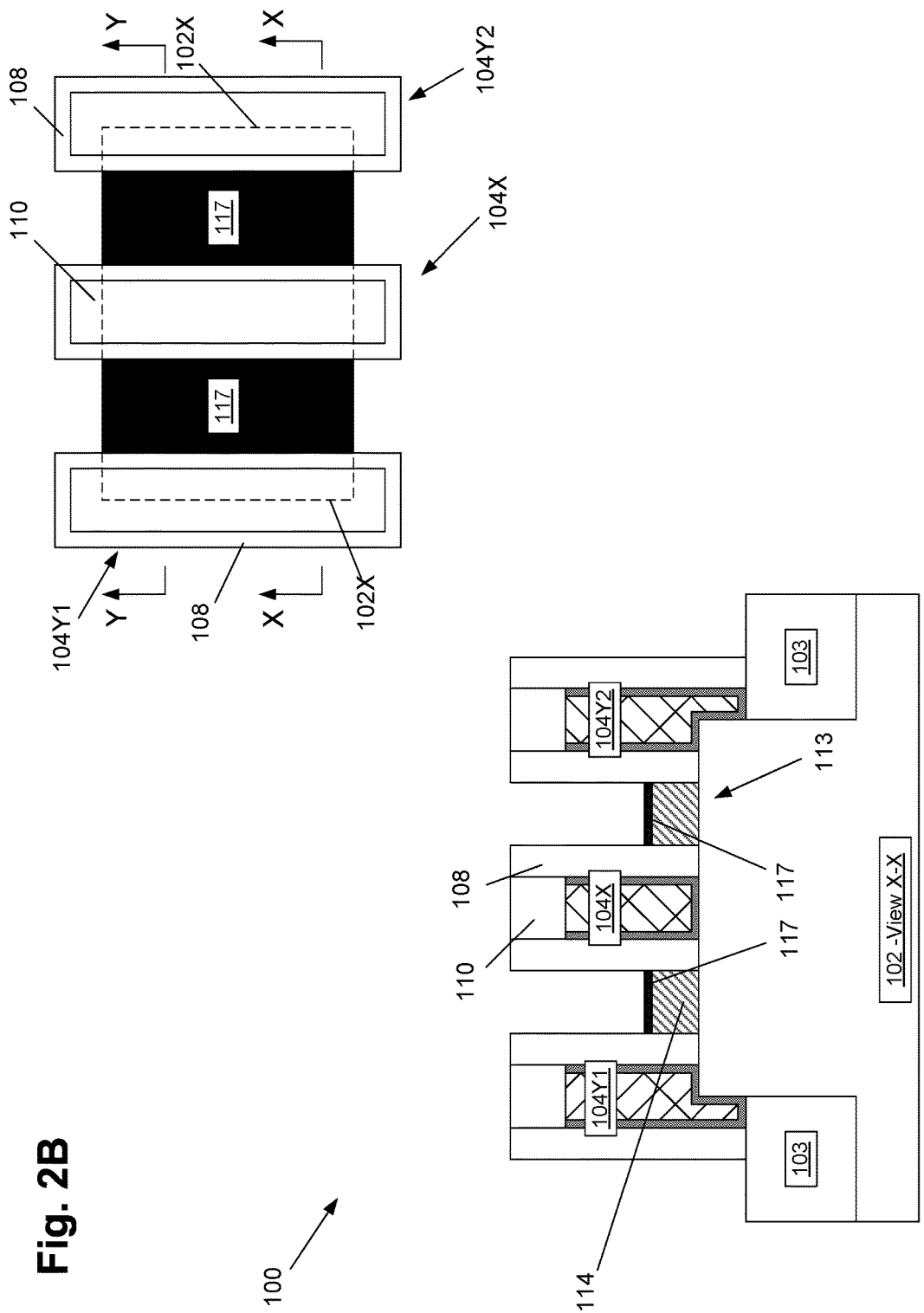

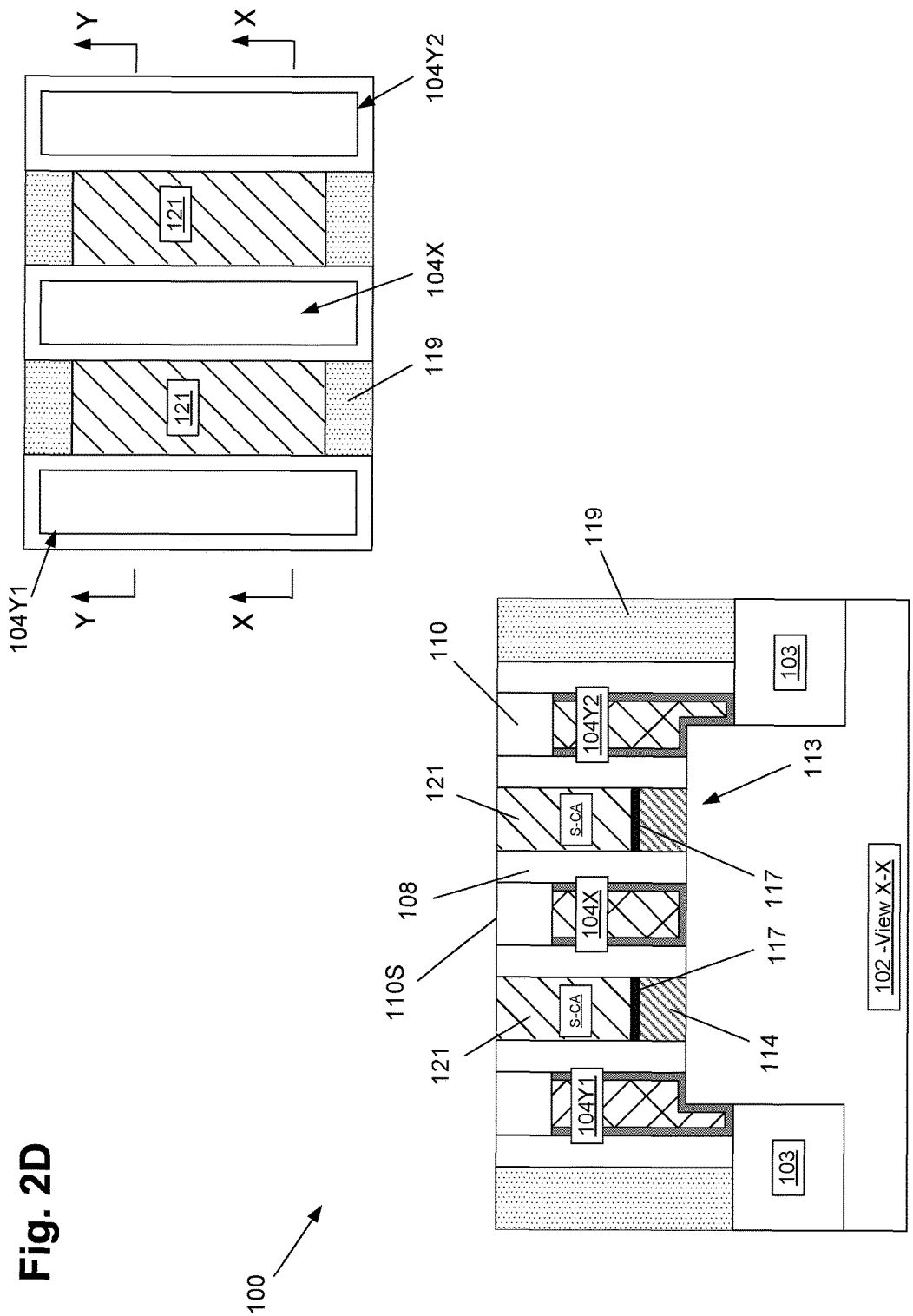

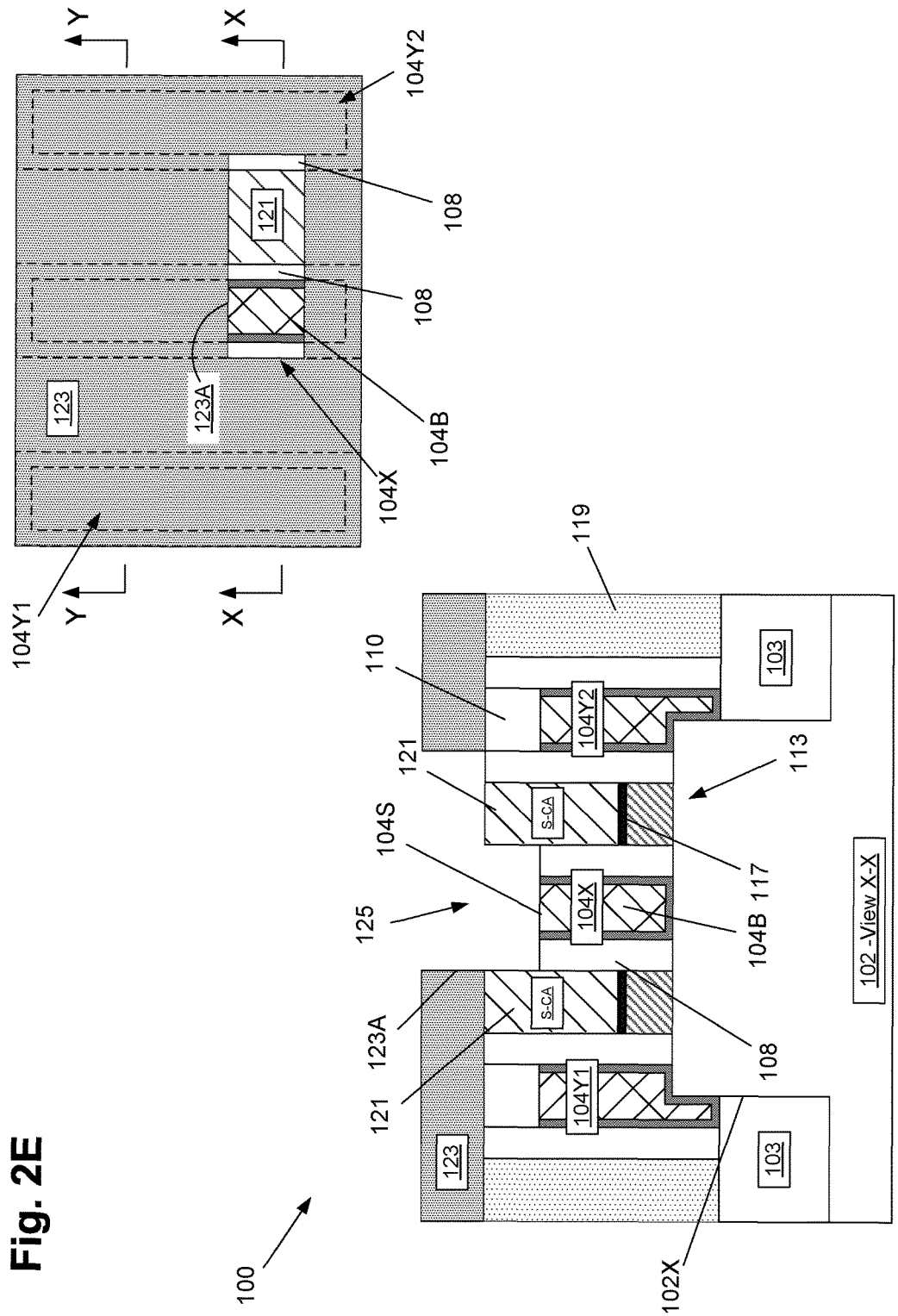

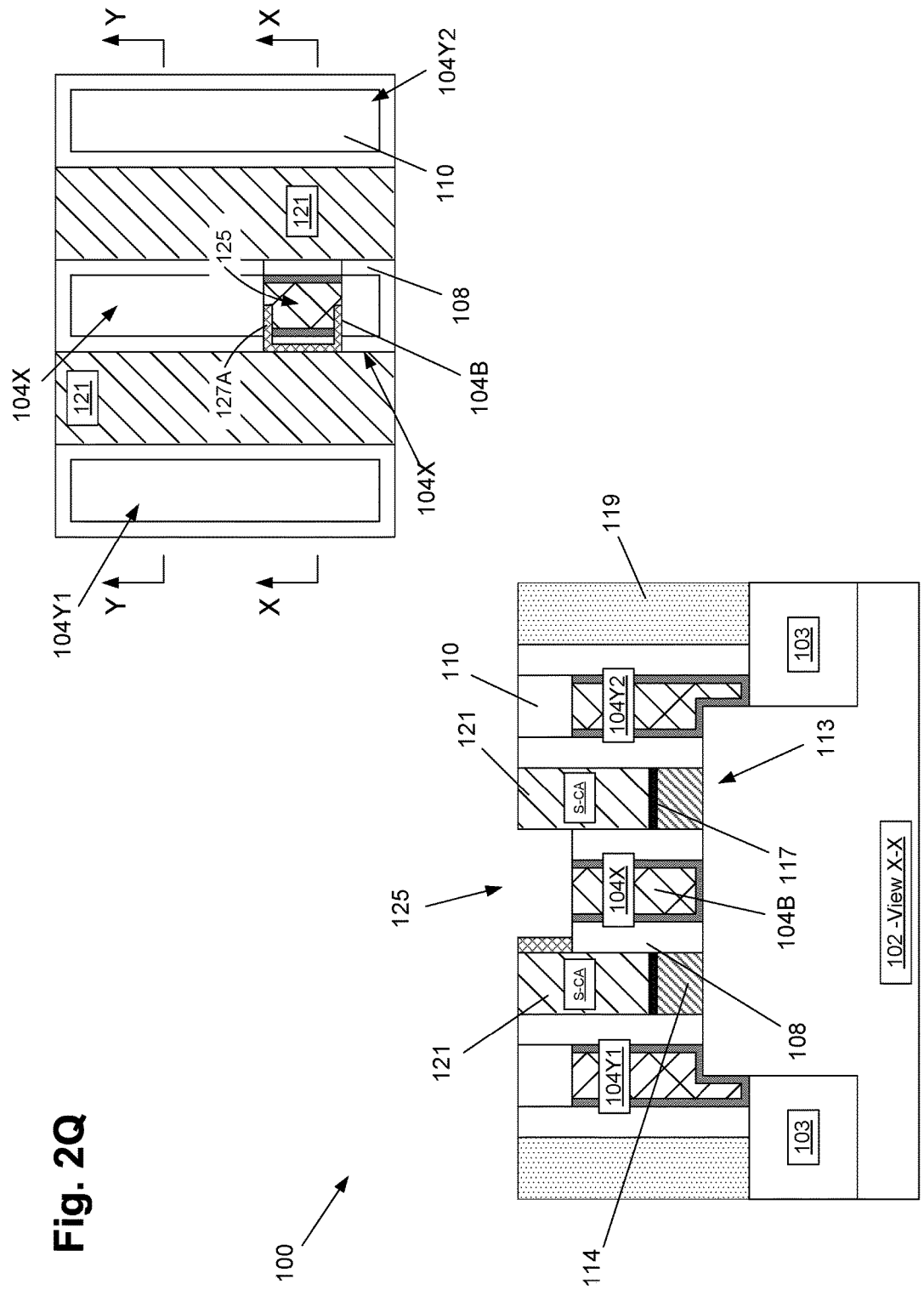

METHOD OF FORMING A GATE CONTACT STRUCTURE AND SOURCE/DRAIN CONTACT STRUCTURE FOR A SEMICONDUCTOR DEVICE

BACKGROUND OF THE INVENTION

1. Field of the Invention

The present disclosure generally relates to the fabrication of integrated circuits, and, more particularly, to various methods of forming a gate contact structure and source/drain (S/D) contact structures for a semiconductor device and the resulting device structures.

2. Description of the Related Art

In modern integrated circuits, such as microprocessors, storage devices and the like, a very large number of circuit elements, especially field effect transistors (FETs), are provided and operated on a restricted chip area. FETs come in a variety of different configurations, e.g., planar devices, FinFET devices, nanowire devices, etc. These FET devices are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

To improve the operating speed of FETs, and to increase the density of FETs on an integrated circuit device, device designers have greatly reduced the physical size of FETs over the years, particularly the channel length of transistor devices. As a result of the reduced dimensions of the transistor devices, the operating speed of the circuit components has been increased with every new device generation, and the "packing density," i.e., the number of transistor devices per unit area, in such products has also increased during that time. Typically, due to the large number of circuit elements and the required complex layout of modern integrated circuits, the electrical connections or "wiring arrangement" for the individual circuit elements cannot be established within the same device level on which the circuit elements are manufactured. Accordingly, the various electrical connections that constitute the overall wiring pattern for the integrated circuit product are formed in one or more additional stacked so-called "metallization layers" that are formed above the device level of the product. These metallization layers are typically comprised of layers of insulating material with conductive metal lines or conductive vias formed in the layers of material. Generally, the conductive lines provide the intra-level electrical connections, while the conductive vias provide the inter-level connections or vertical connections between different levels. These conductive lines and conductive vias may be comprised of a variety of different materials, e.g., copper, with appropriate barrier layers, etc. The first metallization layer in an integrated circuit product is typically referred to as the "M1" layer, while the conductive vias that are used to establish electrical connection between the M1 layer and lower level conductive structures (explained more fully below) are typically referred to as "V0" vias. The conductive lines and conductive vias in these metallization layers are typically comprised of copper, and they are formed in layers of insulating material using known damascene or dual-damascene techniques.

FIG. 1A is a cross-sectional view of an illustrative integrated circuit product 10 comprised of a plurality of transistor devices 15 formed in and above a semiconductor substrate 12. A schematically depicted isolation region 13 has also been formed in the substrate 12. In the depicted example, the transistor devices 15 are comprised of an illustrative gate structure, i.e., a gate insulation layer 15A and a gate electrode 15B, a gate cap layer 21, a sidewall spacer 23 and simplistically depicted S/D regions 25. At the point of fabrication depicted in FIG. 1A, layers of insulating material 17A, 17B, i.e., interlayer dielectric materials, have been formed above the product 10. Other layers of material, such as contact etch stop layers and the like, are not depicted in the attached drawings. Also depicted are illustrative raised epi S/D regions 25X and S/D conductive contact structures 27 which include a combination of a so-called "trench silicide" (TS) structure 29 and a so-called "CA contact" structure 31. Also depicted is a gate contact structure 33 which is sometimes referred to as a "CB contact" structure. The CB contact 33 is formed so as to contact a portion of the gate electrode 15B of one of the transistors 15. In a plan view, the CB gate contact 33 is positioned vertically above the isolation region 13 that surrounds the product 10, i.e., the CB gate contact 33 is not positioned above the active region defined in the substrate 12. The CA contact structures 31 may be in the form of discrete contact elements, i.e., one or more individual contact plugs having a generally square-like or cylindrical shape, that are formed in an interlayer dielectric material, as shown in FIG. 1A. In other applications (not shown in FIG. 1A), the CA contact structures 31 may also be a line-type feature that contacts underlying line-type features, e.g., the TS structure 29 that contacts the S/D region 25, 25X and typically extends across the entire active region on the S/D region 25.

Also depicted in FIG. 1A is the first metallization layer—the so-called M1 layer—of the multi-level metallization system for the product 10 that is formed in a layer of insulating material 35, e.g., a low-k insulating material. A plurality of conductive vias—so-called V0 vias 37—are provided to establish electrical connection between the device-level contacts—CA contacts 31 and the CB contact 33—and the M1 layer. The M1 layer typically includes a plurality of metal lines 39 that are routed as needed across the product 10.

In one embodiment, the process flow of forming the TS structures 29, CA contacts 31 and CB contacts 33 may be as follows. After the first layer of insulating material 17A is deposited, TS openings are formed in the first layer of insulating material 17A that expose portions of underlying S/D regions 25, 25X. Thereafter, traditional silicide material is formed through the TS openings, followed by forming tungsten (not separately shown) on the metal silicide regions, and performing a chemical mechanical polishing (CMP) process down to the top of the gate cap layer 21. Then, the second layer of insulating material 17B is deposited and contact openings for the CA contacts 31 are formed in the second layer of insulating material 17B that expose portions of the underlying tungsten metallization above the S/D regions 25. Next, while the opening for the CA contacts 31 is masked, the opening for the CB contact 33 is formed in the second layer of insulating material 17B and through the gate cap layer 21 so as to expose a portion of the gate electrode 15B. Typically, the CB contact 33 is in the form of a round or square plug. Thereafter, the conductive CA contacts 31 and the conductive CB contact 33 are formed in their corresponding openings in the second layer of insulating material 17B by performing one or more common metal deposition and CMP process operations, using the second layer of insulating material 17B as a polish-stop layer to remove excess material positioned outside of the contact openings. The CA contacts 31 and CB contact 33 typically contain a uniform body of metal, e.g., tungsten, and may also include one or more metallic barrier layers (not shown) positioned between the uniform body of metal and the layer of insulating material 17B. The S/D contact structures 27 (TS contacts 29, CA contacts 31) and the CB contact 33 are all considered to be device-level contacts within the industry.

FIG. 1B is a simplistic plan view of an illustrative FinFET device comprised of three illustrative fins 41. Also depicted are illustrative CA contacts 31, a CB contact 33, a gate cap layer 21, a sidewall spacer 23 and the trench silicide structures 29 formed above the S/D regions 25. As noted above, the CB gate contact 33 is positioned vertically above the isolation region 13 that surrounds the product 10, i.e., the CB gate contact 33 is not positioned above the active region defined in the substrate 12. The CB gate contact 33 is positioned above the isolation region 13 so as to avoid or reduce the chances of creating an electrical short between the CB contact 33 and the TS structure 29, i.e., there is a minimum spacing 43 that must be maintained between these two structures according to various design rules in an attempt to prevent such electrical shorts. Unfortunately, there is an area penalty associated with the requirement that the CB contact 33 only be positioned above the isolation region 13 and maintaining a minimum value for the spacing 43. The problem is the same for essentially all types of transistor configurations, e.g., planar FET devices, FinFET devices, etc. What is needed is a method for forming the CB gate contact 33 above the active region of the device so as to conserve valuable plot space on an integrated circuit product.

The present disclosure is directed to various methods of forming a gate contact structure and S/D contact structures for a semiconductor device and the resulting device structures that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming a gate contact structure and S/D contact structures for a semiconductor device and the resulting device structures. One illustrative method disclosed includes, among other things, forming a sacrificial S/D contact structure above an S/D region of a transistor device, removing at least a portion of a gate cap and at least a portion of a gate sidewall spacer to define a gate contact cavity that is positioned entirely above the active region and exposes an upper surface of a gate structure of the transistor device, and forming an internal sidewall spacer within the gate contact cavity. In this example, the method also includes, after forming the internal sidewall spacer, performing at least one process operation to remove at least the sacrificial S/D contact structure and define an S/D contact cavity and expose the S/D region, and forming a gate contact structure within the gate contact cavity that is conductively coupled to the gate structure and forming a S/D contact structure within the S/D contact cavity that is conductively coupled to the S/D region, wherein a portion of the internal sidewall spacer within the gate contact cavity is positioned between the gate contact structure and the S/D contact structure.

Another illustrative method disclosed herein includes, among other things, forming a sacrificial S/D contact structure above an S/D gate sidewall spacer to define a gate contact cavity that is positioned entirely above the active region and expose an upper surface of a gate structure of the transistor device, forming an internal sidewall spacer within an entire inner perimeter of the gate contact cavity, and removing a portion, but not all, of the internal spacer from within the gate contact cavity. In this example, the method further includes performing at least one process operation to remove at least the sacrificial S/D contact structure and define an S/D contact cavity and expose the S/D region, and forming the combination gate/source drain (S/D) contact structure within the gate contact cavity and within the S/D contact cavity, wherein the combination gate/source drain (S/D) contact structure is conductively coupled to the gate structure and to the S/D region, and wherein a remaining portion of the internal sidewall spacer remains positioned within the gate contact cavity.

BRIEF DESCRIPTION OF THE DRAWINGS

The disclosure may be understood by reference to the following description taken in conjunction with the accompanying drawings, in which like reference numerals identify like elements, and in which.

Figure 1A:
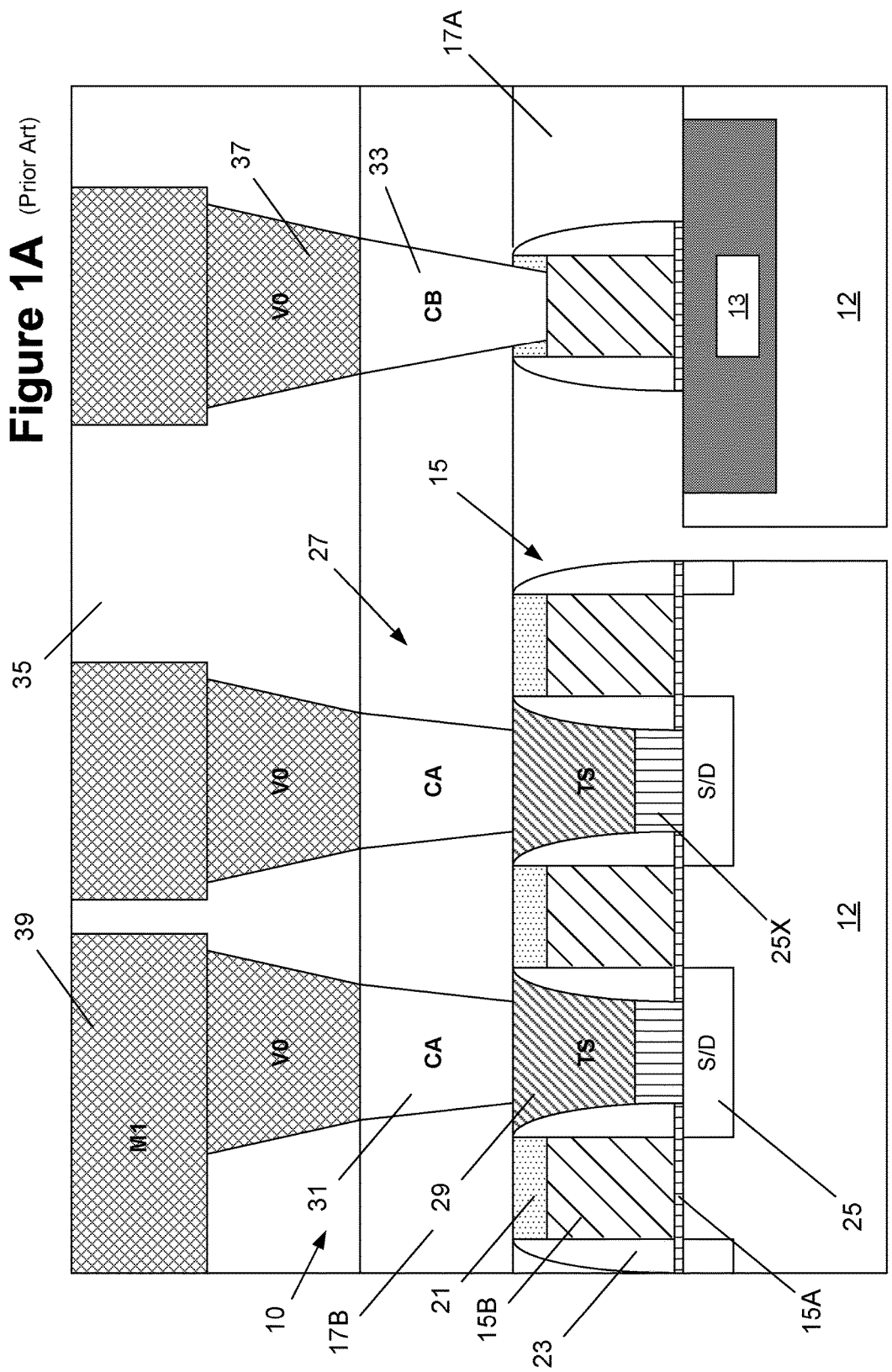
FIGS. 1A-1B depict various illustrative prior art arrangements of device-level contacts and metallization layers for an integrated circuit product.
Figure 1B:
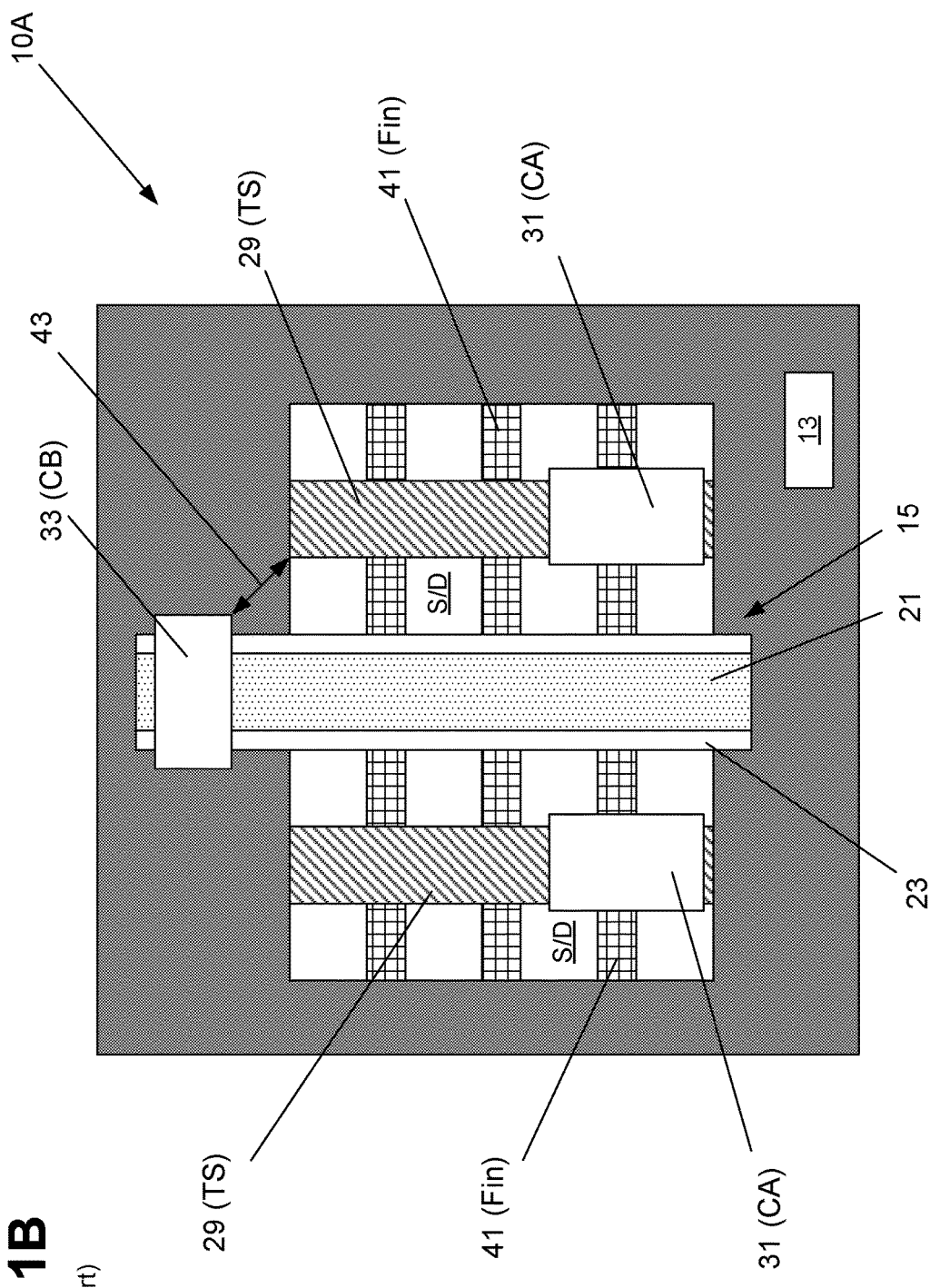

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The methods and devices disclosed herein may be employed in manufacturing products using a variety of technologies, e.g., NMOS, PMOS, CMOS, etc., and they may be employed in manufacturing a variety of different integrated circuit products, e.g., memory products, logic products, ASICs, etc. As will be appreciated by those skilled in the art after a complete reading of the present application, the inventions disclosed herein may be employed in forming integrated circuit products using transistor devices in a variety of different configurations, e.g., planar devices, FinFET devices, nanowire devices, etc. Thus, the presently disclosed inventions should not be considered to be limited to any particular form of semiconductor devices. Of course, the inventions disclosed herein should not be considered to be limited to the illustrative examples depicted and described herein. With reference to the attached figures, various illustrative embodiments of the methods and devices disclosed herein will now be described in more detail. The various layers of material described below may be formed by any of a variety of different known techniques, e.g., a chemical vapor deposition (CVD) process, an atomic layer deposition (ALD) process, a thermal growth process, spin-coating techniques, etc. Moreover, as used herein and in the attached claims, the word "adjacent" is to be given a broad interpretation and should be interpreted to cover situations where one feature actually contacts another feature or is in close proximity to that other feature.

Figure 2A:
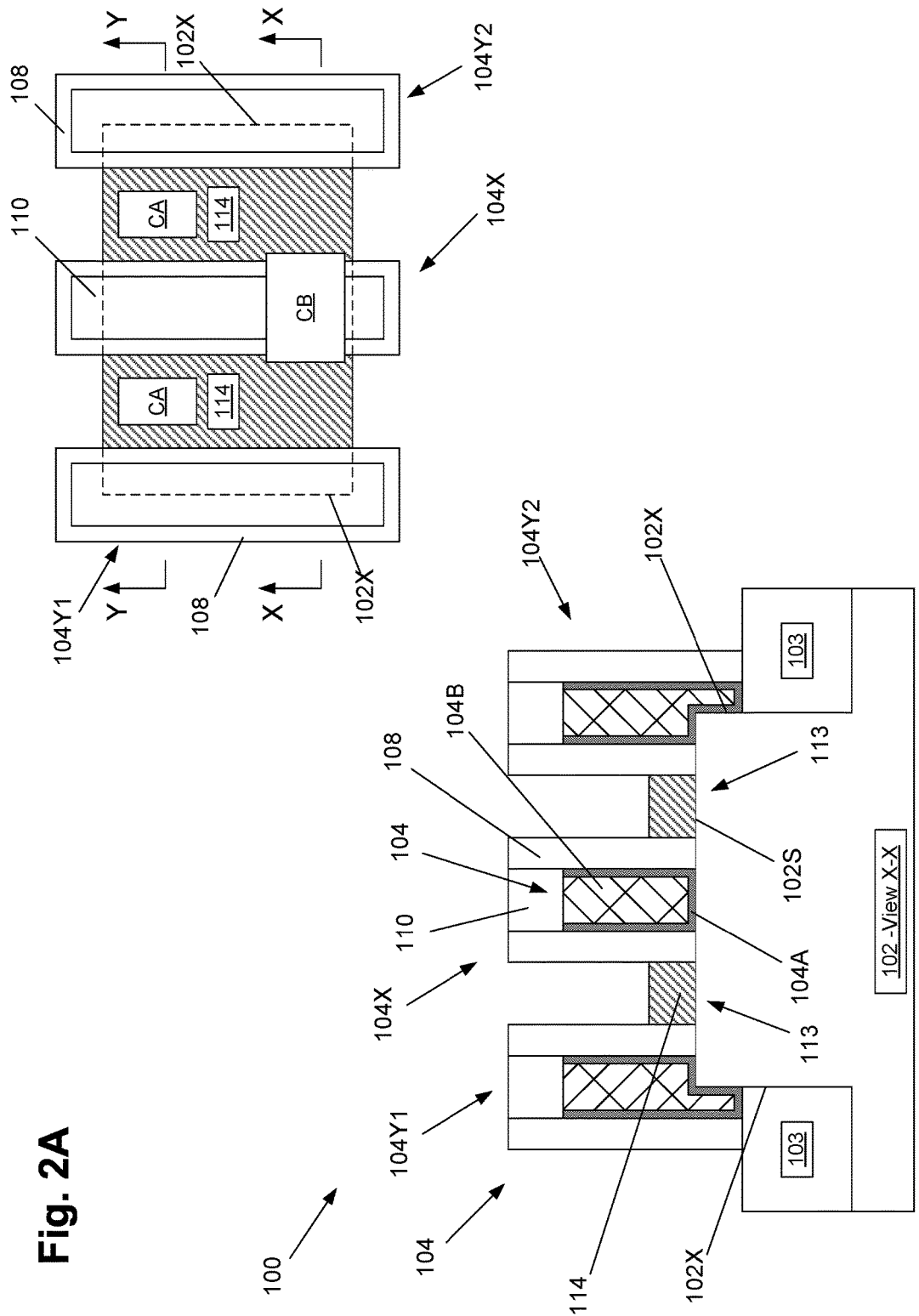
FIGS. 2A-2R depict various novel methods disclosed herein for methods of forming a gate contact structure and S/D contact structures for a semiconductor device and the resulting device structures.
Figure 2C:
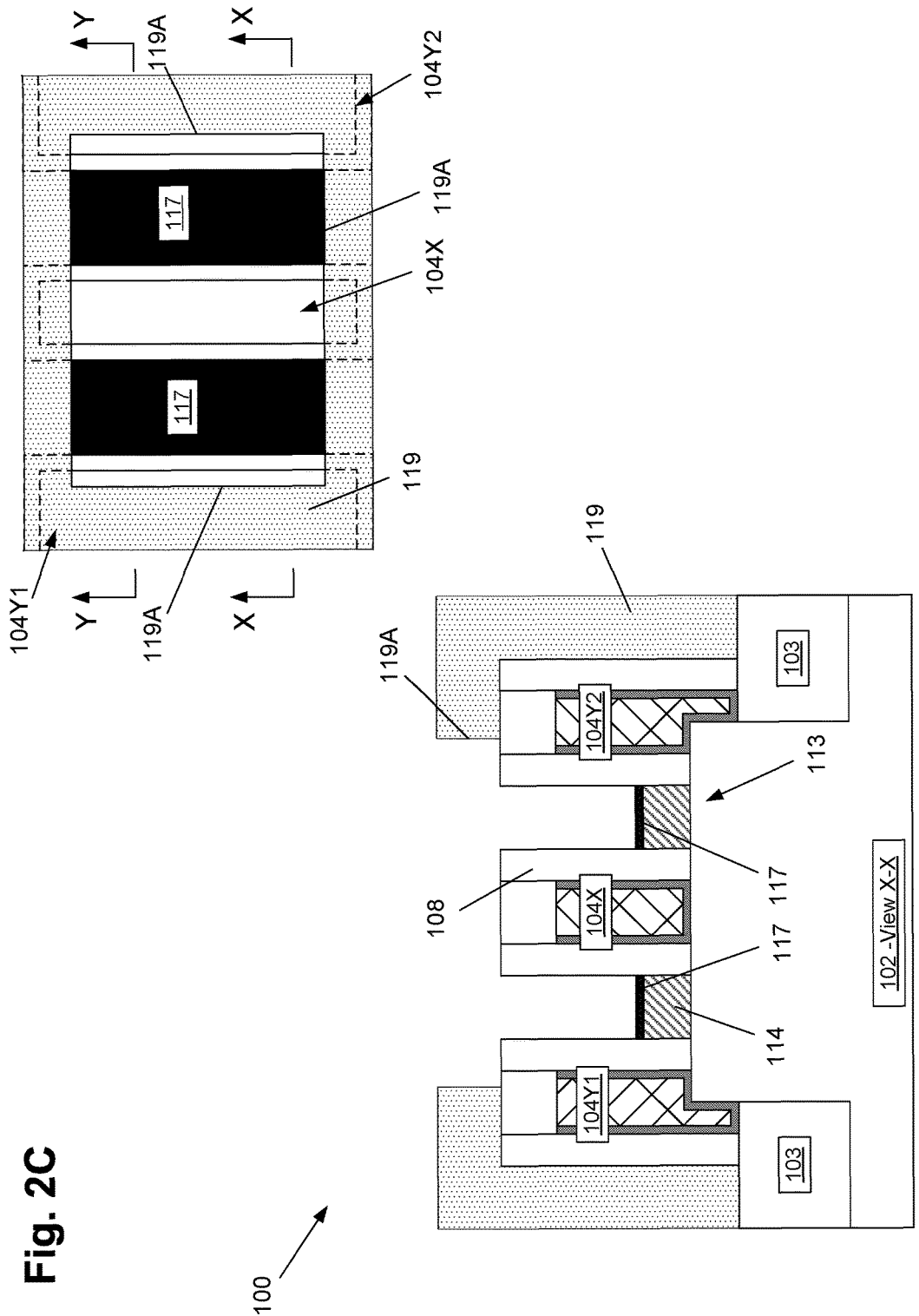
Figure 2F:
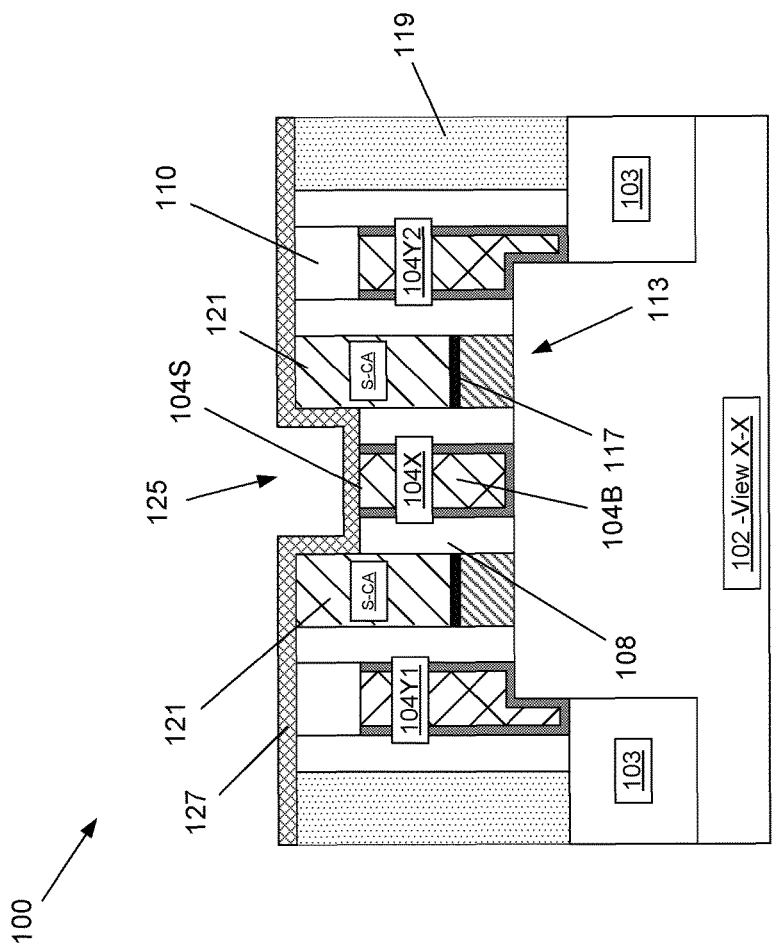
Figure 2G:
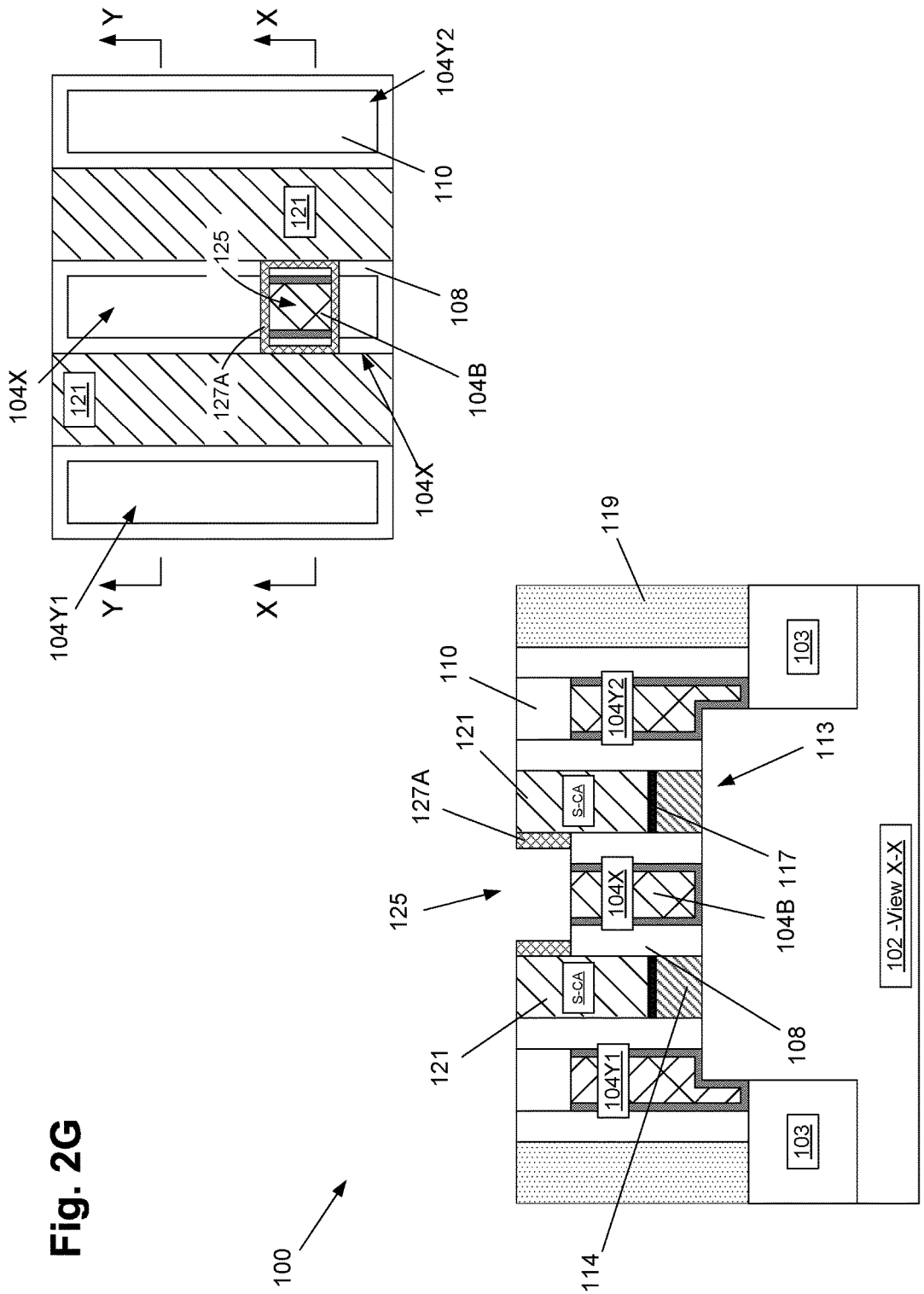
Figure 2H:
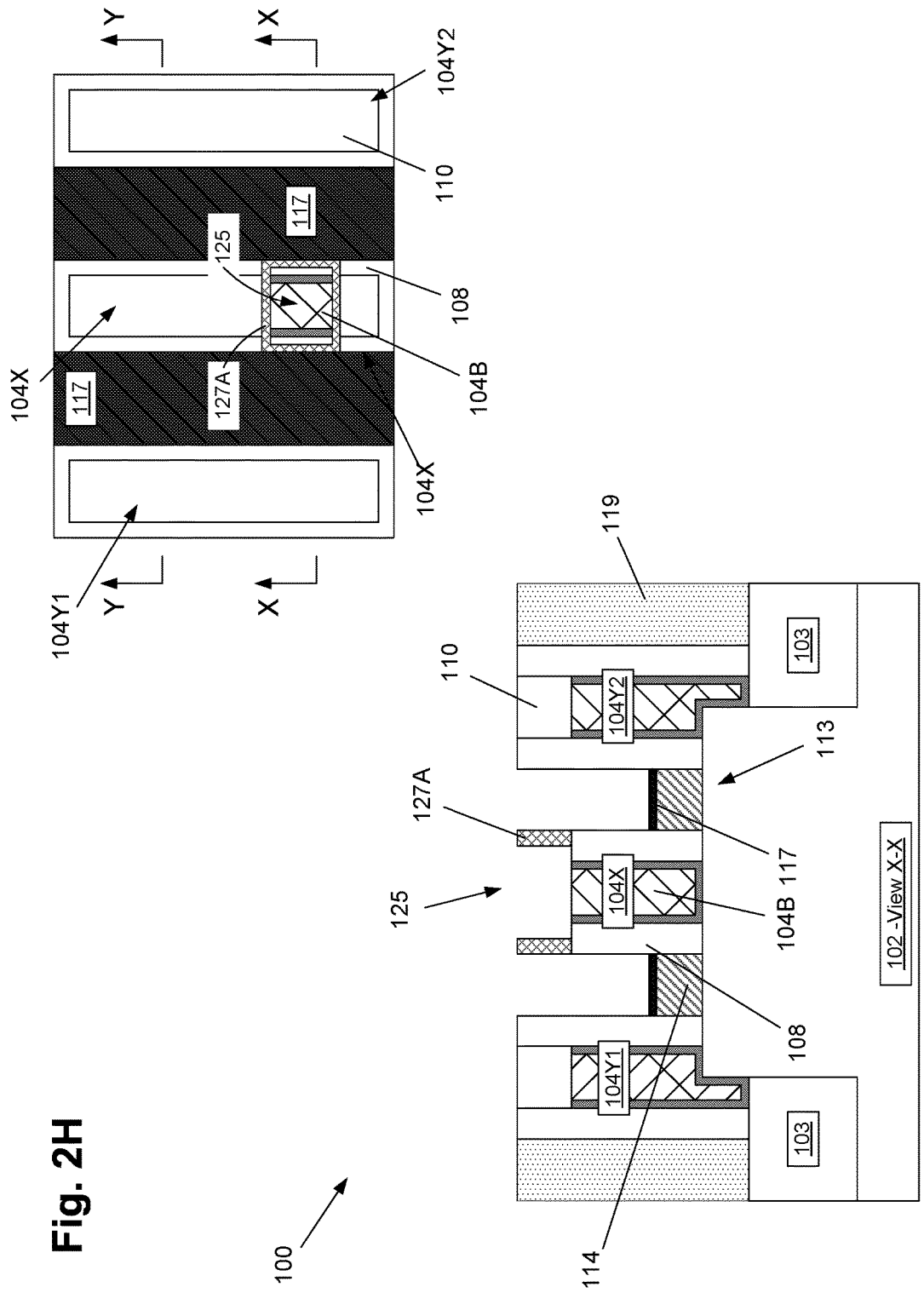
Figure 2I:
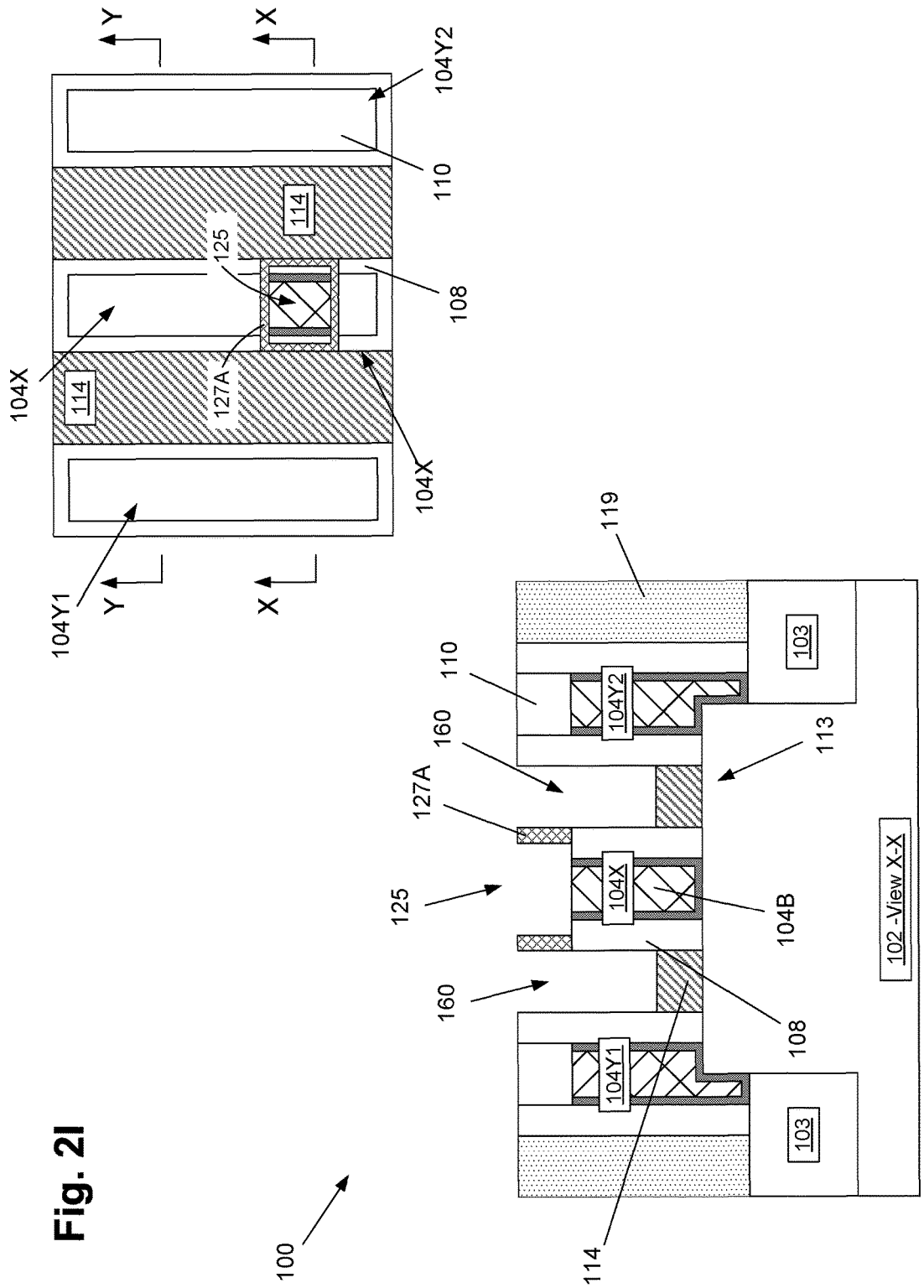
Figure 2J:
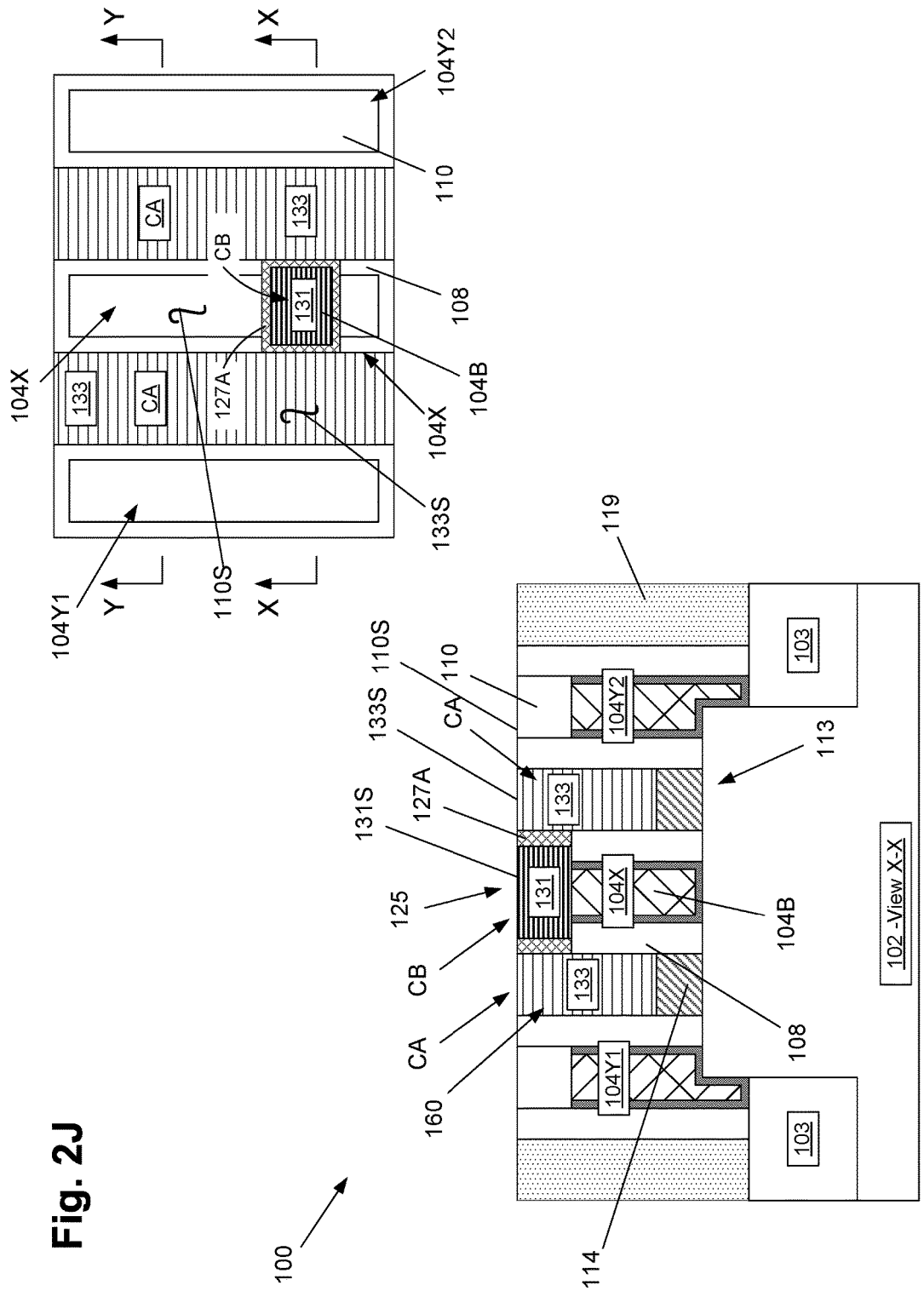
Figure 2K:
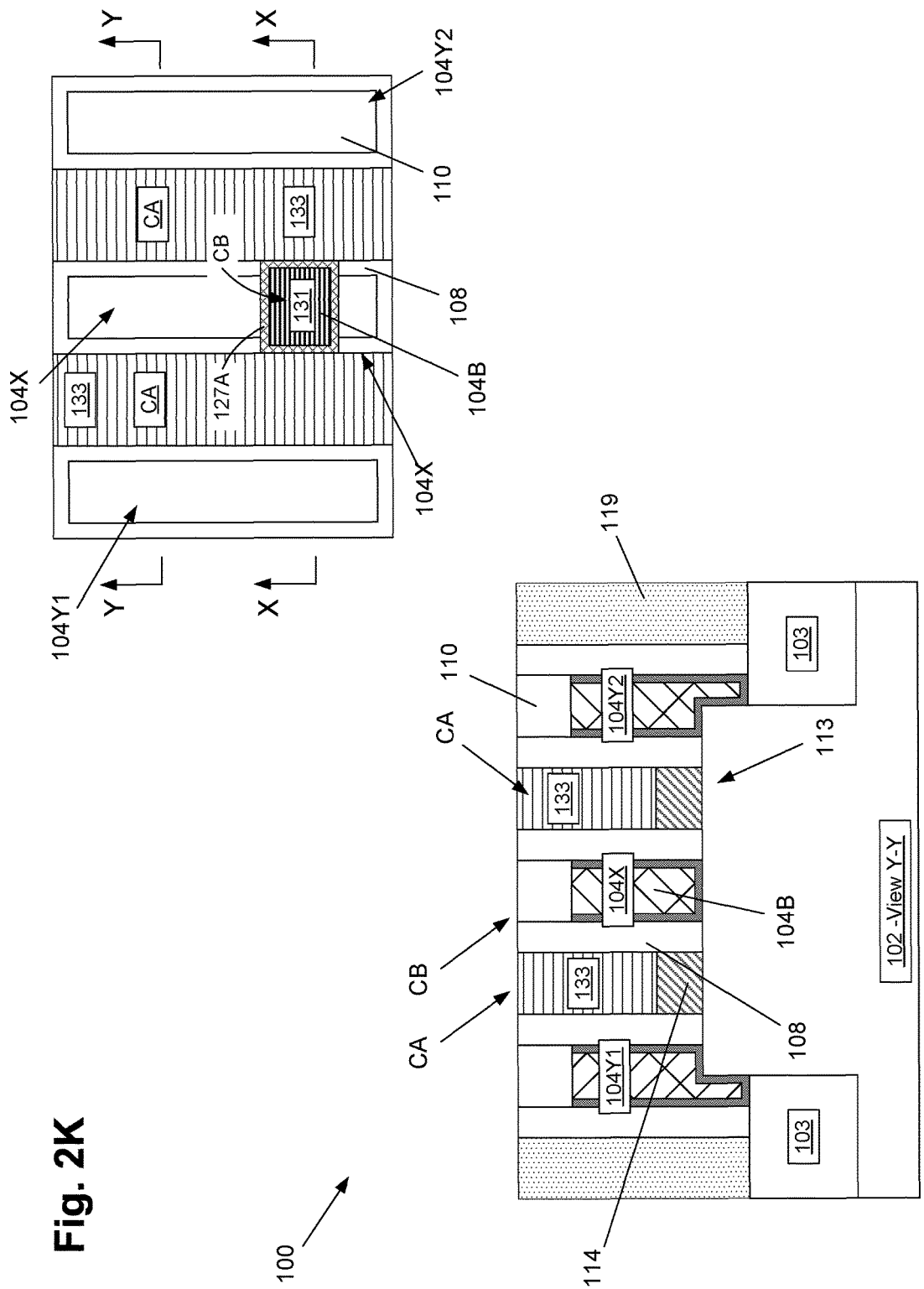
Figure 2L:
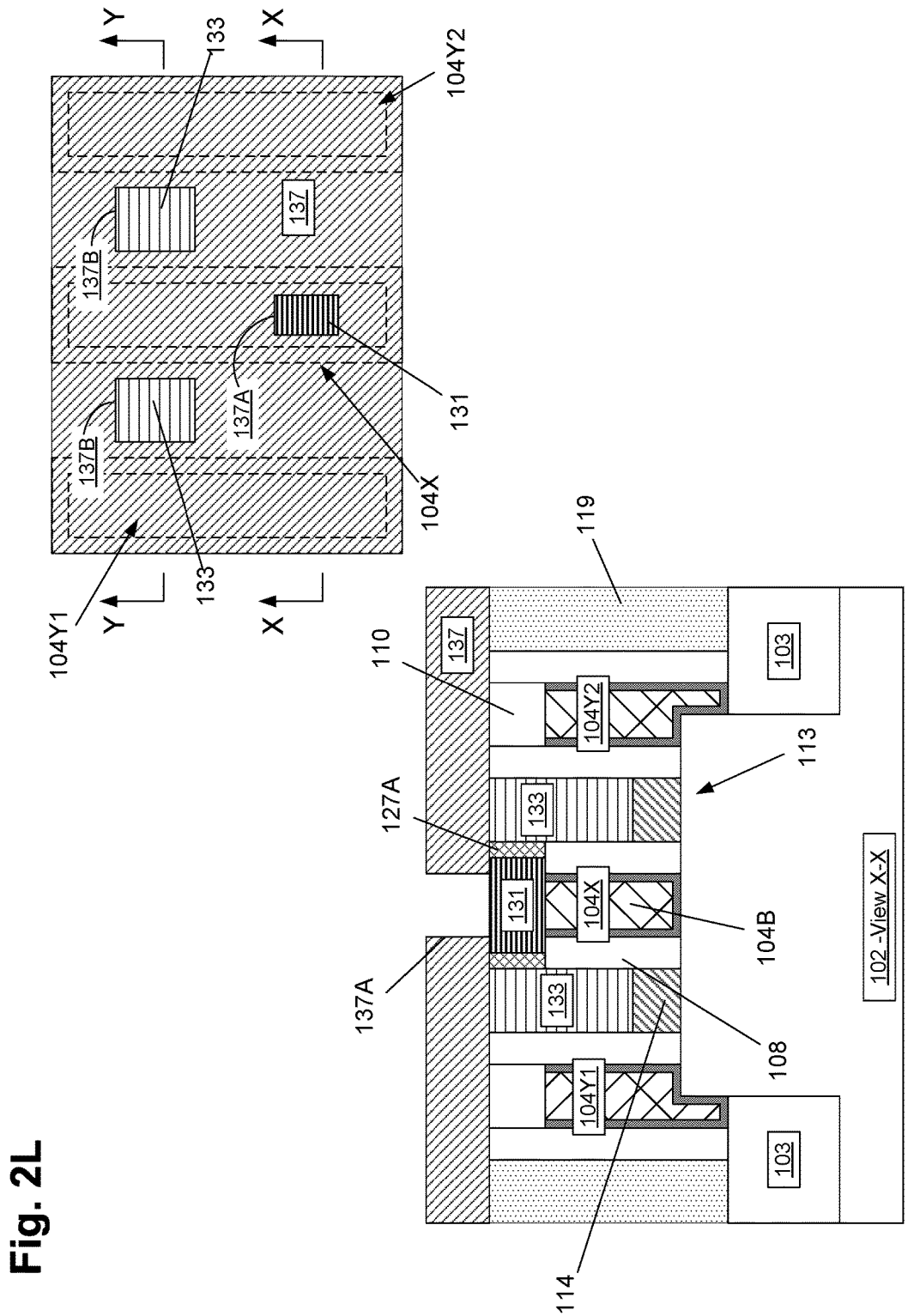
Figure 2M:
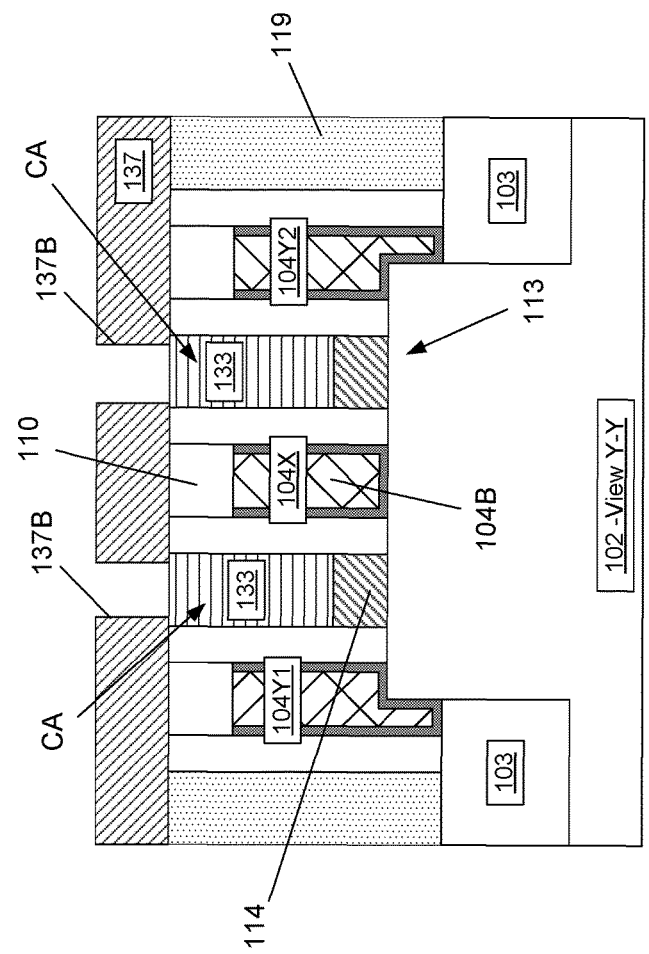
Figure 2N:
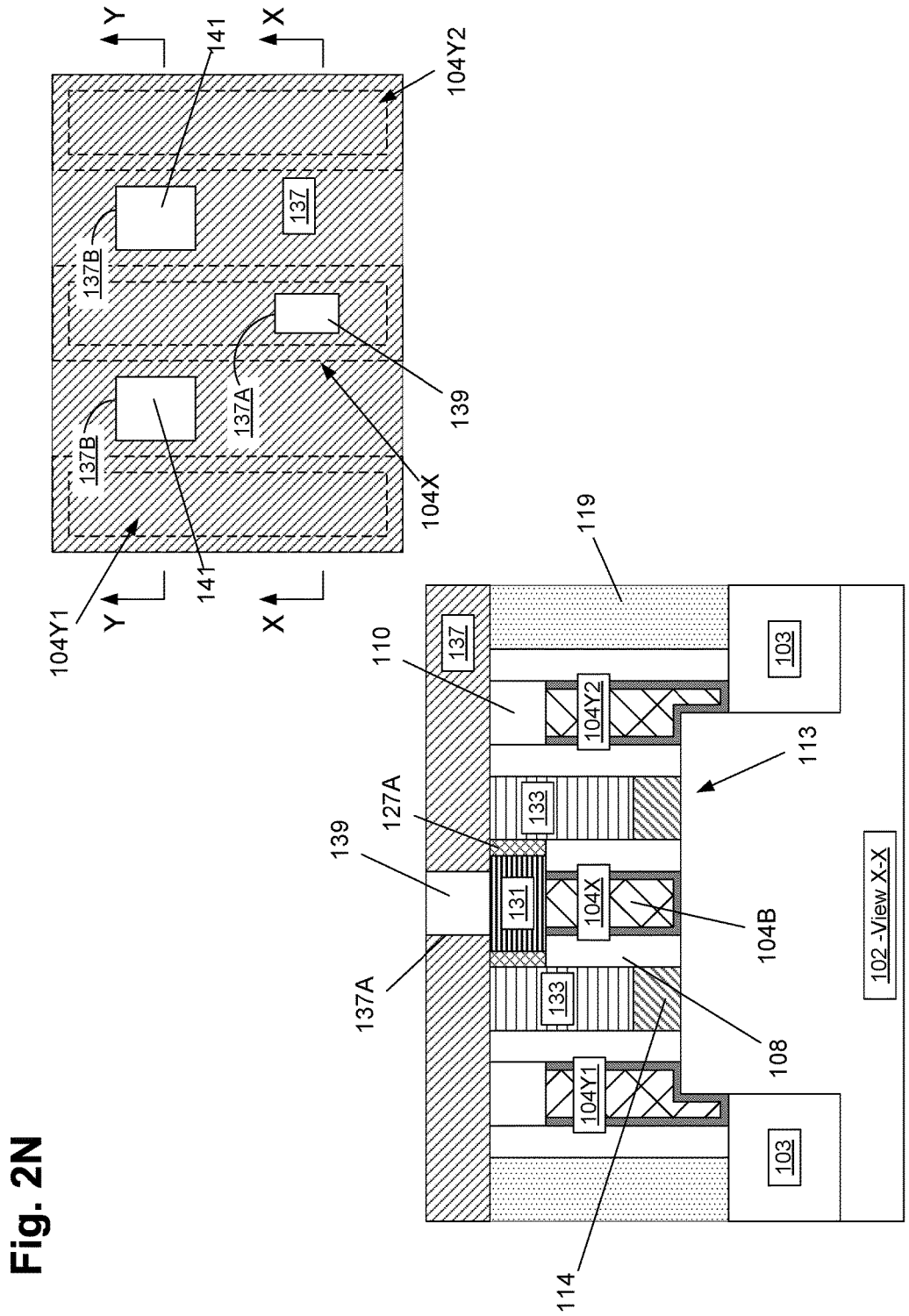
Figure 20:
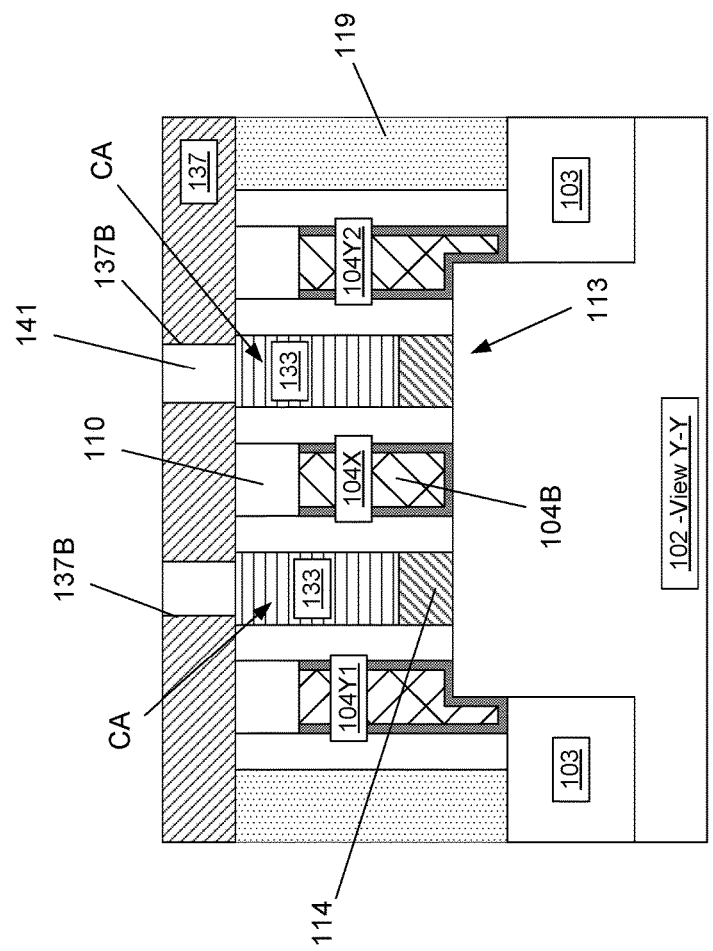
Figure 2P:
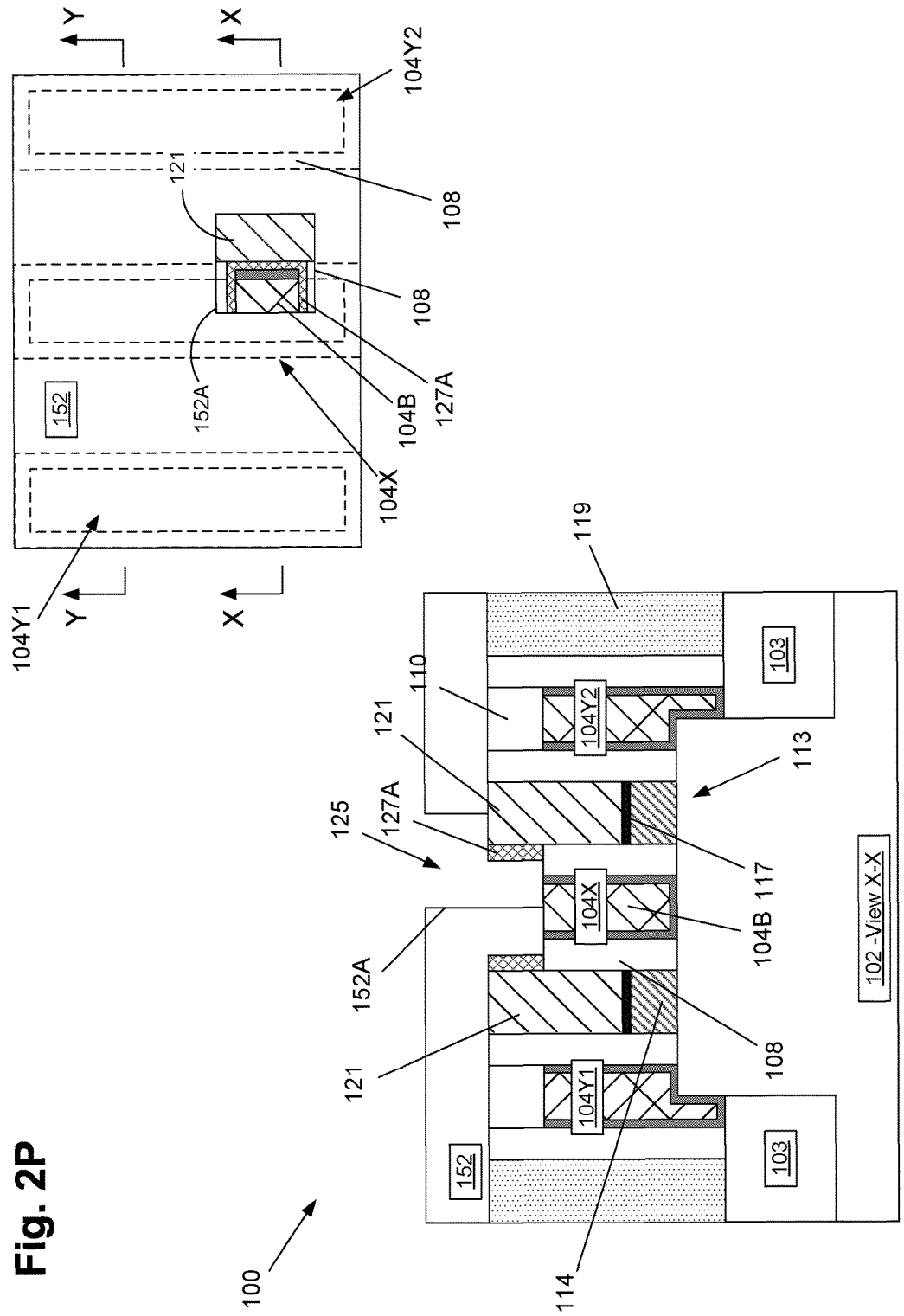
Figure 2R:
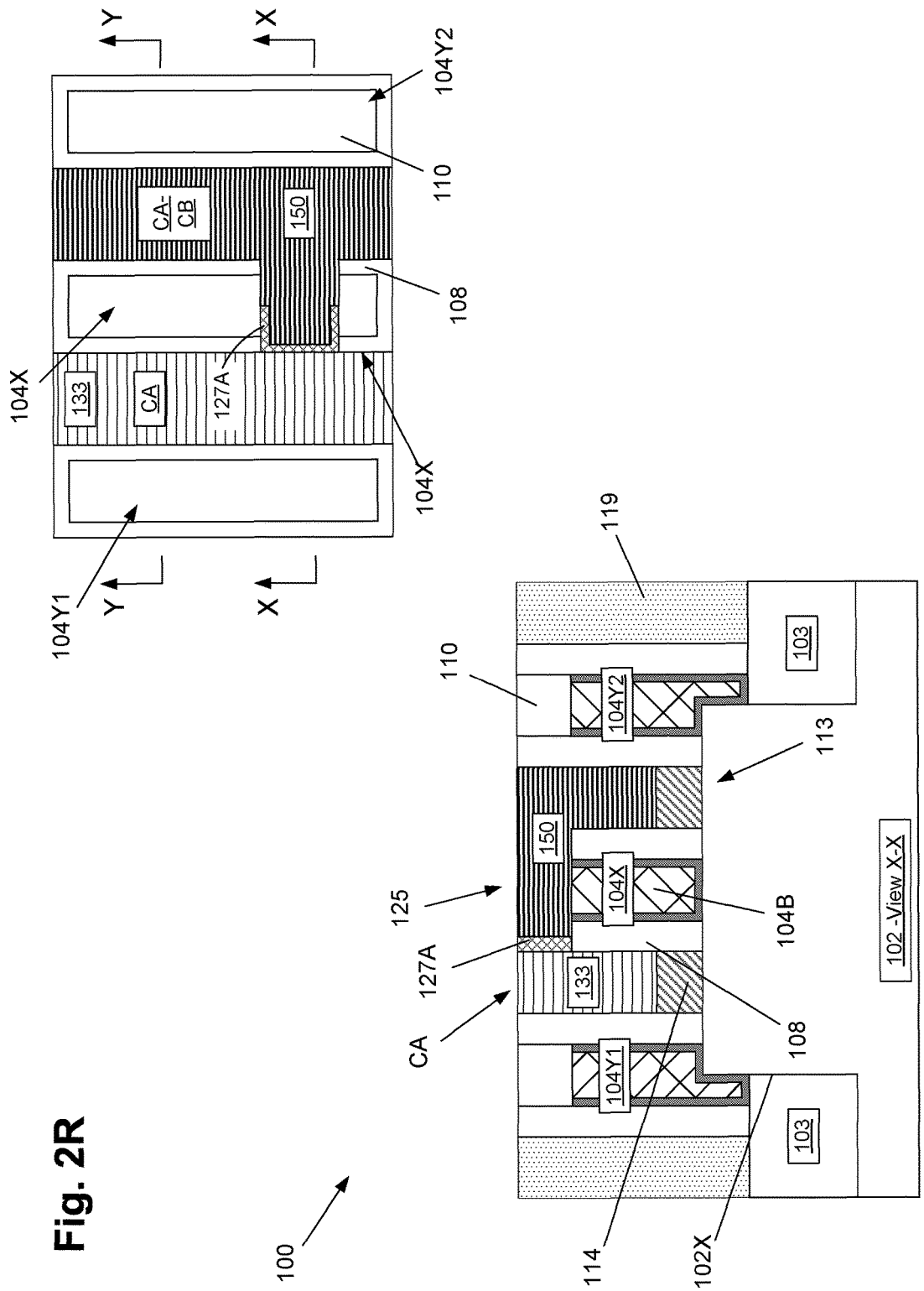

FIGS. 2A-2R depict various novel methods disclosed herein for forming a gate contact structure and source/drain (S/D) contact structures for a semiconductor device and the resulting device structures. Many of the figures contain a simplistic plan view showing where various cross-sectional views are taken in the drawings. The plan view also depicts where illustrative S/D contacts ("CA") and a gate contact ("CB") will eventually be formed for the product 100. As indicated in FIG. 2A, the view X-X is a cross-sectional view taken through the device (in a direction corresponding to the gate length direction of the device) at a location where the gate contact ("CB") will eventually be formed. The view Y-Y is a cross-sectional view taken through the device (in a direction corresponding to the gate length direction of the device) at a location where the S/D contacts ("CA") will eventually be formed. It should also be noted that not all aspects of the processing shown in the cross-sectional views will be depicted in the plan views so as to not overly complicate the drawings.

With continuing reference to FIG. 2A, the illustrative product 100 will be formed in and above a semiconductor substrate 102. The product 100 may comprise either NMOS transistors, PMOS transistors or both types of transistors. Additionally, various doped regions, e.g., S/D extension implant regions, halo implant regions, well regions and the like, are not depicted in the attached drawings. The substrate 102 may have a variety of configurations, such as the depicted bulk silicon configuration. The substrate 102 may also have a semiconductor-on-insulator (SOI) configuration that includes a bulk silicon layer, a buried insulation layer and an active layer, wherein semiconductor devices are formed in and above the active layer. The substrate 102 may be made of silicon or it may be made of semiconductor materials other than silicon. Thus, the terms "substrate" or "semiconductor substrate" should be understood to cover all semiconducting materials and all forms of such materials.

In the example depicted herein, the novel methods and devices will be described in the context of using a replacement gate manufacturing technique to form the gate structure for the product 100. Accordingly, FIG. 2A depicts the product 100 at a point in fabrication wherein several process operations have been performed to form a plurality of illustrative replacement gate structures 104 using traditional replacement gate manufacturing techniques. First, an isolation region 103 was formed in the substrate 102 so as to define an active region 102X where a transistor device will be formed. Next, a plurality of illustrative replacement gate structures 104 was formed above the substrate 102. The gate structure 104X is the active gate structure for the transistor device, while the gate structures 104Y1 and 104Y2 are non-functional "dummy" gate structures as it relates to the operation of the transistor device. Of course, the dummy gate structures may constitute active gate structures for other devices (not shown) formed above other active regions (not shown).

The replacement gate structures 104 depicted herein are intended to be representative in nature of any type of gate structure that may be employed in manufacturing integrated circuit products using so-called gate-last (replacement gate) manufacturing techniques. A typical replacement gate process that results in the structure depicted in FIG. 2A may be as follows: formation of a sacrificial gate structure (not shown) that typically includes a sacrificial gate insulation layer, such as silicon dioxide, and a dummy or sacrificial gate electrode, such as polysilicon or amorphous silicon; formation of a gate sidewall spacer 108 and a sacrificial gate cap layer (both of which are typically comprised of silicon nitride); formation of an epi semiconductor material 114 in the S/D regions 113 of the transistor devices (the epi semiconductor material 114 need not be formed in all applications); removal of the sacrificial gate cap layer and the sacrificial gate structure to define a replacement gate cavity between the gate spacer 108; formation of the replacement gate structure 104 in the replacement gate cavity; performing one or more recess etching processes to recess the replacement gate materials within the gate cavities so as to thereby make room for the final gate cap 110; and formation of the final gate cap 110. The physical size of the replacement gate structures 104 and the gate pitch for the gate structures may vary depending upon the particular application. In the case where the device is a planar transistor device, the epi semiconductor material 114 forms across the entire upper surface 102S of the active region. In the case where the device is a FinFET transistor device, the epi semiconductor material 114 may constitute only discrete regions of epi material that are formed around the fins (an unmerged S/D region). In other applications involving a FinFET device with merged S/D regions, sufficient epi material 114 may be grown on the fins such that the epi material 114 forms a substantially continuous layer of epi material 114 above the entire active region in the S/D regions of the device. In the case of a FinFET device, the upper surface 102S of the substrate 102 shown in the cross-sectional view would be the upper surface of a fin. In some applications, the epi semiconductor material 114 (if present) may be comprised of a material such as silicon-germanium (for PMOS devices) or silicon-carbon (for NMOS devices).

The replacement gate structures 104 may be comprised of a variety of different materials. In one illustrative embodiment, the replacement gate structures 104 may comprise a high-k (k value greater than 10) gate insulation layer 104A, such as hafnium oxide (or other high-k materials), and one or more conductive metal or metal alloy layers (e.g., titanium, titanium nitride), all of which were deposited across the substrate 102 and within the gate cavity by performing several conformal deposition processes. Thereafter, the gate cavity was filled with a bulk metal such as tungsten. At the end of all of these metal formation processes, the replacement gate cavity is overfilled with material. Then, one or more CMP processes were performed to remove excess materials positioned outside of the gate cavity. Next, the replacement gate materials were recessed as described above and the gate cap layer 110 was formed above the recessed replacement gate structures 104. These process operations result in the definition of the illustrative and simplistically depicted replacement gate structures 104 depicted in FIG. 2A.

FIG. 2B depicts the product after a protective layer 117 was selectively formed on the epi semiconductor material 114 in the S/D regions of the device. In one illustrative embodiment, the protective layer 117 may be a layer of silicon dioxide that is formed by performing a thermal growth process. The protective layer 117 may be comprised of other materials as well, e.g., silicon oxynitride, silicon-carbon, etc. The protective layer 117 may not be required in all applications, depending upon the materials of construction for other components of the device.

FIG. 2C depicts the product after several process operations were performed. First, an illustrative layer of insulating material 119, e.g., silicon dioxide, etc., was formed above the substrate 102. Thereafter, an etching process was performed through a patterned etch mask (not shown), such as a patterned layer of photoresist material, to thereby define an opening 119A in the layer of insulating material 119 that exposes the S/D regions 113 of the device, i.e., it exposes the protective layer 117 in the depicted example. In one example, depending upon the materials of construction for the layers 117 and 119, the etching process may be a timed etching process. The protective layer 117 protects the underlying epi material 114 during the etching of the layer of insulating material 119.

FIG. 2D depicts the product 100 after several process operations were performed. First, a layer of sacrificial material 121 was formed so as to overfill the opening 119A and the space between the adjacent gate structures 104 above the protection layer 117. Thereafter, one or more planarization processes, e.g., one or more CMP processes, was performed to remove excess materials positioned above the upper surface 110S of the gate caps 110. As depicted, these operations result in the formation of sacrificial S/D contact structures 121 (S-CA) positioned above the S/D regions 113 of the device. In the depicted example, the sacrificial S/D contact structures 121 extend across the entire active region (in a direction corresponding to the gate width direction of the device). The sacrificial S/D contact structures 121 may be comprised of a variety of different materials that may be selectively removed by etching relative to the surrounding materials, as will be described more fully below. In one illustrative embodiment, the sacrificial S/D contact structures 121 may be comprised of a material such as, for example, polysilicon, amorphous silicon, an organic film material, silicon carbide, etc.

FIG. 2E depicts the product 100 after several process operations were performed. First, a patterned masking layer 123 was formed above the product 100. The patterned masking layer 123 comprises an opening 123A that exposes an area above a portion of the gate structure for the active gate 104X where a gate contact structure will eventually be formed. Thereafter, one or more etching processes were performed through the opening 123A to remove the exposed portions of the gate cap 110 and reduce the height of the gate spacer 108 on the active gate 104X. These process operations result in the formation of a gate contact cavity 125 that exposes at least a portion or upper surface 104S of the gate structure, i.e., the gate electrode 104B and the gate insulation layer 104A, of the active gate 104X. Note that the gate contact cavity 125 is positioned entirely vertically above the active region 102X. Also note that, after the gate contact cavity 125 is formed, both the gate structure and the sacrificial S/D contact structures 121 are exposed relative to one another within the gate contact cavity 125. The patterned masking layer 123 may be comprised of a variety of different materials, e.g., it may be a patterned layer of photoresist material or a patterned hard mask layer. The physical size, shape and configuration of the opening 123A and the gate contact cavity 125 may vary depending upon the particular application.

FIG. 2F depicts the product after several process operations were performed. First, the patterned masking layer 123 was removed from the product 100. Thereafter, a layer of spacer material 127 was formed on the product 100 by performing a conformal deposition process. As depicted, the layer of spacer material 127 was formed within the gate contact cavity 125. No attempt has been made to show a plan view of the product 100 after the initial deposition of the layer of spacer material 127. The layer of spacer material 127 may be comprised of a variety of materials, e.g., silicon dioxide, silicon oxynitride, silicon carbide, etc., and it may be formed by performing a conformal ALD or CVD process. The thickness of the layer of spacer material 127 may vary depending upon the particular application, e.g., 2-8 nm.

FIG. 2G depicts the product 100 after an anisotropic etching process was performed on the layer of spacer material 127 so as to define an internal sidewall spacer 127A positioned around the entire internal or inner perimeter of the gate contact cavity 125 above the gate spacer 108. In one illustrative embodiment, the lateral width of the internal spacer 127A (at its base) may be about 2-8 nm.

FIG. 2H depicts the product after an etching process was performed to selectively remove the sacrificial S/D contact structures 121 relative to the surrounding materials. In the depicted example, the removal of the sacrificial S/D contact structures 121 exposes the optional protective layer 117 in the S/D regions 113 of the device. The protective layer 117 protects the underlying epi material 114 during the removal of the sacrificial S/D contact structures 121.

FIG. 2I depicts the product 100 after an etching process was performed to selectively remove the protective layer 117 relative to the surrounding materials. This etching process exposes the epi material 114 in the S/D regions 113 of the device so that electrical contact may be made to the S/D regions 113 of the device. In the example depicted herein, the etching processes described in FIGS. 2H-2I collectively define a plurality of S/D contact cavities 160. Of course, in some applications, the protective layer 117 may not be present or it may be consumed during the removal of the sacrificial S/D contact structures 121, as shown in FIG. 2H. In that situation, the removal of at least the sacrificial S/D contact structures 121 would define the S/D contact cavities 160.

FIGS. 2J (view X-X) and 2K (view Y-Y) depict the product 100 after a simplistically depicted conductive CB gate contact structure 131 was formed to establish electrical contact to the gate structure of the active gate 104X, and after simplistically depicted S/D contact structures 133 were formed so as to establish contact to the raised epi S/D regions 114 of the source/drain regions 113. More specifically, the CB gate contact structure 131 was formed within the gate contact cavity 125, while the S/D contact structures 133 were formed within the S/D contact cavities 160. Also note that, in this embodiment, the CB gate contact structure 131 is positioned within the gate contact cavity 125 and the entire outer perimeter of the gate contact structure 131 is surrounded by the internal spacer 127A so that the CB gate contact structure 131 is electrically isolated from the S/D contact structures 133 by the internal spacer 127A. Additionally, using the technique disclosed herein, the upper surface 131S of the CB gate contact structure 131 and the upper surfaces 133S of the S/D contact structures 133 are substantially planar with the upper surface 110S of the gate cap 110 on the gates 104Y1, 104Y2. The CB gate contact structure 131 and the S/D contact structures 133 may be formed using any of a variety of different conductive materials and, in one particular application, they may be comprised of the same conductive materials. In one illustrative embodiment, the CB gate contact structure 131 and the S/D contact structures 133 may be comprised of one or more conductive metal-containing materials, e.g., tungsten, cobalt or copper, with a titanium, titanium nitride, tantalum, or tantalum nitride liner (not shown). In one illustrative example, the conductive metal materials for the CB gate contact structure 131 and the S/D contact structures 133 may be formed by depositing a liner (not separately shown), e.g., Ti, TiN, followed by overfilling the gate contact cavity 125 and S/D contact cavities 160 (i.e., the spaces formerly occupied by the sacrificial S/D contact structures 121) with a conductive material, such as tungsten or cobalt. Thereafter, a CMP process may be performed to planarize the upper surface of the layer of insulating material 119 using the gate caps 110 as a polish-stop to remove excess materials positioned above the gate caps 110.

The next series of operations involve forming conductive V0 contacts to the CB gate contact structure 131 and the S/D contact structures 133. Accordingly, FIGS. 2L (view X-X) and 2M (view Y-Y) depict the product 100 after an illustrative layer of insulating material 137, e.g., silicon dioxide, was blanket-deposited above the product 100. The layer of insulating material 137 may be the same material as that of the layer of material 119. Different shading is provided for the layer of insulating material 137 simply to show it was formed at a later point in the illustrative process flow depicted herein than was the layer of insulating material 119. Thereafter, a patterned masking layer (not shown) was formed above the layer of insulating material 137 and an etching process was performed through the patterned masking layer to define a V0 contact opening 137A for contacting the CB gate contact structure 131 (see FIG. 2L) and a plurality V0 contact openings 137B (see FIG. 2M) in the layer of insulating material 137 for contacting the S/D contact structures 133. The overall size and shape of the V0 contact openings 137A, 137B may vary depending upon the particular application.

FIGS. 2N (view X-X) and 2O (view Y-Y) depict the product 100 after several process operations were performed to form conductive material(s) in the V0 contact openings 137A, 137B so as to ultimately define a V0 contact 139 for the CB gate contact structure 131 and a plurality of V0 contacts 141 for the S/D contact structures 133. In one illustrative example, the conductive materials for the V0 contacts 139, 141 may be formed by depositing a liner (not separately shown), e.g., Ti, TiN, followed by overfilling the V0 contact openings 137A, 137B with a conductive material, such as tungsten or cobalt. Thereafter, a CMP process may be performed to planarize the upper surface of the layer of conductive material so as to remove excess materials positioned above the layer of insulating material 137. At this point in processing, additional manufacturing operations may be performed to complete the manufacture of the product 100. For example, additional metallization layers, e.g., M1 and above, may be formed above the product 100.

FIGS. 2P-2R depict another process flow wherein a combination CA/CB contact structure 150 may be formed above the active region 102X of the device. Such combination CA/CB contact structures provide an electrical short between the gate structure of the active gate 104X and one of the S/D regions 113 of the device. Such an arrangement can be useful in many integrated circuit product applications, e.g., for providing so-called "handshakes" between devices formed on separate active regions or for forming cross-coupled devices, such as SRAM devices.

FIG. 2P depicts the product 100 at a point in fabrication corresponding to that shown in FIG. 2G, i.e., after the formation of the internal spacer 127A in the gate contact cavity 125. As shown in FIG. 2P, a patterned masking layer 152 was formed above the product 100. The patterned masking layer 152 comprises an opening 152A that exposes an area above a portion of the internal spacer 127A for the active gate 104X.

FIG. 2Q depicts the product 100 after several process operations were performed. First, an etching process was performed through the opening 152A to remove only the exposed portions of the internal spacer 127A. Thereafter, the patterned masking layer 152 was removed. Note that a remaining portion of the spacer 127A will serve to isolate the combination CA/CB contact structure 150 from what will become a CA contact structure 133 on the left side of the gate structure 104X.

FIG. 2R depicts the product after the processing sequences described above in FIGS. 2H-2K were performed, e.g. removal of the sacrificial S/D contact structures 121 and formation of the conductive materials for the CB gate contact structure 131 and the S/D contact structures 133. However, in this embodiment, due to the removal of a portion, but not all, of the internal spacer 127A, the combination CA/CB contact structure 150 was formed above the active region 102X of the device, i.e., a combination of the CB gate contact structure 131 and one of the S/D contact structures 133 described above. As depicted, the remaining portion of the internal spacer 127A electrically isolates the S/D contact structure 133 on the left side of the gate 104X from the combination CA/CB contact structure 150. At this point, the above described V0 contacts 139, 141 may be formed on the product 100, wherein the contact 139 may be conductively coupled to the combination CA/CB contact structure 150. Also note that, although FIGS. 2P-2R depict a processing sequence wherein a portion of the spacer 127A is removed prior to the removal of the sacrificial S/D contact structures 121, in practice, the sacrificial S/D contact structures 121 may be removed prior to removing a portion of the internal spacer 127A.

In the case where the active gate 104X and a conductive S/D contact structure 133 extends above the isolation region 103 between two spaced-apart active regions, i.e., a local interconnect structure, this same process flow, i.e., removal of a portion of the internal spacer 127A, may be employed to form a combination CA/CB contact structure 150 over the isolation region 103 between the gate structure of the active gate 104X and a portion of the conductive S/D contact structure 133 that spans across the isolation region between the two spaced-apart active regions.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a gate contact for a gate structure of a transistor device formed above an active region defined in a semiconductor substrate, said transistor device comprising a source/drain (S/D) region, a gate structure having a gate cap positioned above said gate structure and a gate sidewall spacer positioned adjacent said gate structure, the method comprising:
    forming a sacrificial S/D contact structure above said S/D region;
    removing at least a portion of said gate cap and at least a portion of said gate sidewall spacer to define a gate contact cavity that is positioned entirely above said active region, wherein said gate contact cavity exposes an upper surface of said gate structure and a sidewall surface of said sacrificial S/D contact structure;
    forming an internal sidewall spacer within said gate contact cavity and contacting said sidewall surface of said sacrificial S/D contact structure;
    after forming said internal sidewall spacer, performing at least one process operation to remove at least said sacrificial S/D contact structure and define an S/D contact cavity and expose said S/D region;
    forming a gate contact structure within said gate contact cavity that is conductively coupled to said gate structure; and
    forming a S/D contact structure within said S/D contact cavity that is conductively coupled to said S/D region, wherein a portion of said internal sidewall spacer within said gate contact cavity is positioned between said gate contact structure and said S/D contact structure.

2. The method of claim 1, wherein forming said sacrificial S/D contact structure above said S/D region comprises:
    depositing a layer of sacrificial material comprising one of polysilicon or amorphous silicon above said S/D region and proximate said gate sidewall spacer; and
    performing a chemical mechanical polishing (CMP) process to remove excess portions of said layer of sacrificial material positioned above said gate cap.

3. The method of claim 1, wherein forming said internal sidewall spacer within said gate contact cavity comprises:
    performing a conformal deposition process to form a layer of internal spacer material above said sacrificial S/D contact structure and within said gate contact cavity; and
    performing an anisotropic etching process on said layer of internal spacer material to thereby define said internal sidewall spacer positioned on an entire inner perimeter of said gate contact cavity.

4. The method of claim 1, wherein performing said at least one process operation to remove at least said sacrificial S/D contact structure and define said S/D contact cavity and expose said S/D region comprises:
    performing a first etching process to remove said sacrificial S/D contact structure from above a protective layer formed on and in contact with said S/D region; and
    performing a second etching process to remove said protective layer from above said S/D region.

5. The method of claim 1, wherein said internal sidewall spacer within said gate contact cavity extends around an entire outer perimeter of said gate contact structure.

6. The method of claim 1, wherein forming said gate contact structure within said gate contact cavity and forming said S/D contact structure within said S/D contact cavity comprises
    depositing one or more layers of metal-containing material in said gate contact cavity and in said S/D contact cavity; and
    performing at least one chemical mechanical polishing (CMP) process to remove portions of said deposited layers of metal-containing material positioned outside of said gate contact cavity and outside of said S/D contact cavity above said gate cap.

7. The method of claim 6, wherein said one or more layers of metal-containing material comprise one of tungsten, cobalt, titanium, tantalum, titanium nitride, tantalum nitride or copper.

8. The method of claim 1, wherein forming said gate contact structure within said gate contact cavity and forming said S/D contact structure within said S/D contact cavity comprises forming said gate contact structure and said S/D contact structure from a same conductive material.

9. The method of claim 1, wherein forming said gate contact structure within said gate contact cavity and forming said S/D contact structure within said S/D contact cavity comprises forming said gate contact structure and said S/D contact structure such that an upper surface of said gate contact structure and an upper surface of said S/D contact structure are substantially co-planar with an upper surface of said gate cap.

10. The method of claim 1, further comprising:
    forming a layer of insulating material above said gate contact structure and above said S/D contact structure; and
    forming first and second V0 contacts within said layer of insulating material, wherein said first V0 contact is conductively coupled to said gate contact structure and said second V0 contact is conductively coupled to said S/D contact structure.

11. The method of claim 1, wherein said transistor device is one of a FinFET transistor device or a planar transistor device.

12. The method of claim 1, wherein said S/D region comprises an epitaxially grown semiconductor material and wherein said S/D contact structure is formed on and in contact with said epitaxially grown semiconductor material.

13. The method of claim 1, wherein said transistor device comprises a second source/drain (S/D) region, the method further comprises:
forming a second sacrificial S/D contact structure above said second S/D region;
performing the at least one process operation comprises removing at least said second sacrificial S/D contact structure to define a second S/D contact cavity and expose said second S/D region;
forming a second S/D contact structure within said second S/D contact cavity that is conductively coupled to said second S/D region; and
forming the gate contact structure within said gate contact cavity such that the gate contact structure is further conductively coupled to second S/D contact structure.

14. A method of forming a gate contact for a gate structure of a transistor device formed above an active region defined in a semiconductor substrate, said transistor device comprising a source/drain (S/D) region, a gate structure having a gate cap positioned above said gate structure and a gate sidewall spacer positioned adjacent said gate structure, the method comprising:
forming a protective layer above said S/D region;
forming a sacrificial S/D contact structure above said protective layer on said S/D region;
removing at least a portion of said gate cap and at least a portion of said gate sidewall spacer to define a gate contact cavity that is positioned entirely above said active region and exposes an upper surface of said gate structure;
forming an internal sidewall spacer within said gate contact cavity;
after forming said internal sidewall spacer, performing at least one process operation to define an S/D contact cavity and expose said S/D region, wherein performing said at least one process operation comprises:
performing a first etching process to remove said sacrificial S/D contact structure from above said protective layer; and
performing a second etching process to remove said protective layer from above said S/D region;
forming a gate contact structure within said gate contact cavity that is conductively coupled to said gate structure; and
forming a S/D contact structure within said S/D contact cavity that is conductively coupled to said S/D region, wherein said internal sidewall spacer is positioned within said gate contact cavity and around an entire outer perimeter of said gate contact structure and wherein a portion of said internal spacer is positioned between said gate contact structure and said S/D contact structure.

15. The method of claim 14, wherein forming said protective layer above said S/D region comprises forming said protective layer on and in contact with said S/D region.

16. The method of claim 14, wherein forming said sacrificial S/D contact structure above said protective layer comprises forming said sacrificial S/D contact structure on and in contact with said protective layer.

17. The method of claim 14, wherein forming said internal sidewall spacer within said gate contact cavity comprises:
performing a conformal deposition process to form a layer of internal spacer material above said sacrificial S/D contact structure and within said gate contact cavity; and
performing an anisotropic etching process on said layer of internal spacer material to thereby define said internal sidewall spacer within an entire inner perimeter of said gate contact cavity.

18. The method of claim 14, wherein forming said gate contact structure within said gate contact cavity and forming said S/D contact structure within said S/D contact cavity comprises:
depositing one or more layers of metal-containing material in said gate contact cavity and in said S/D contact cavity;
performing at least one chemical mechanical polishing (CMP) process to remove portions of said deposited layers of metal-containing material positioned outside of said gate contact cavity and outside of said S/D contact cavity above said gate cap.

19. The method of claim 14, wherein forming said gate contact structure within said gate contact cavity and forming said S/D contact structure within said S/D contact cavity comprises forming said gate contact structure and said S/D contact structure from a same conductive material.

20. The method of claim 14, wherein forming said gate contact structure within said gate contact cavity and forming said S/D contact structure within said S/D contact cavity comprises forming said gate contact structure and forming said S/D contact structure such that an upper surface of said gate contact structure and an upper surface of said S/D contact structure are substantially co-planar with an upper surface of said gate cap.

* * * * *